United States Patent
Hussain et al.

(10) Patent No.: US 7,623,049 B2
(45) Date of Patent: Nov. 24, 2009

(54) DECODING OF CONTEXT ADAPTIVE VARIABLE LENGTH CODES IN COMPUTATIONAL CORE OF PROGRAMMABLE GRAPHICS PROCESSING UNIT

(75) Inventors: Zahid Hussain, Ascot (GB); Huy Duc Bui, San Jose, CA (US)

(73) Assignee: Via Technologies, Inc., Hsin-Tien, Taipei (TW)

( * ) Notice: Subject to any disclaimer, the term of this patent is extended or adjusted under 35 U.S.C. 154(b) by 0 days.

(21) Appl. No.: 11/760,296

(22) Filed: Jun. 8, 2007

(65) Prior Publication Data

US 2007/0285287 A1    Dec. 13, 2007

Related U.S. Application Data

(60) Provisional application No. 60/811,821, filed on Jun. 8, 2006.

(51) Int. Cl.
*H03M 7/40* (2006.01)

(52) U.S. Cl. .............................. 341/67; 341/51; 341/65

(58) Field of Classification Search .................. 341/51, 341/65, 67; 375/240, 240.2, 240.23, 240.25
See application file for complete search history.

(56) References Cited

U.S. PATENT DOCUMENTS 5,686,916 A * 11/1997 Bakhmutsky ................ 341/67
5,990,812 A * 11/1999 Bakhmutsky ................ 341/67
6,230,209 B1 * 5/2001 Zenda ......................... 709/247

(Continued)

OTHER PUBLICATIONS

Chung-Hyo Kim, In-Cheol Park, Highspeed Decoding of Context-based Adaptive Binary Arithmetic Codes Using Most Probable Symbol Prediction, ISCAS 2006, 2006, pp. 1707-1710, 2006 IEEE.

(Continued)

*Primary Examiner*—Linh V Nguyen
(74) *Attorney, Agent, or Firm*—Thomas, Kayden, Horstemeyer & Risley

(57) ABSTRACT

Various embodiments of decoding systems and methods are disclosed. One system embodiment, among others, comprises a software programmable core processing unit having a context-adaptive variable length coding (CAVLC) unit configured to execute a shader, the shader configured to implement CAVLC decoding of a video stream and provide a decoded data output.

27 Claims, 10 Drawing Sheets

U.S. PATENT DOCUMENTS

| | | | |
|---|---|---|---|
| 6,628,302 | B2 | 9/2003 | White et al. |
| 6,646,578 | B1 | 11/2003 | Au |
| 6,876,317 | B2 | 4/2005 | Sankaran |
| 6,965,328 | B2* | 11/2005 | Ji .................................. 341/50 |
| 7,054,370 | B2* | 5/2006 | Kim ....................... 375/240.25 |
| 7,289,047 | B2* | 10/2007 | Nagori ......................... 341/67 |
| 2004/0101056 | A1* | 5/2004 | Wong et al. ............ 375/240.25 |
| 2005/0117655 | A1 | 6/2005 | Ju |
| 2005/0135691 | A1* | 6/2005 | Reese .......................... 382/246 |
| 2005/0156761 | A1 | 7/2005 | Oh |
| 2005/0249289 | A1* | 11/2005 | Yagasaki et al. ........ 375/240.18 |
| 2005/0259747 | A1 | 11/2005 | Schumann |
| 2006/0126744 | A1 | 6/2006 | Peng et al. |
| 2006/0133512 | A1 | 6/2006 | Park |
| 2007/0024473 | A1* | 2/2007 | Nagori ......................... 341/50 |
| 2007/0040819 | A1 | 2/2007 | Inazumi |
| 2007/0116128 | A1 | 5/2007 | Evans et al. |
| 2007/0183491 | A1 | 8/2007 | Pearson et al. |
| 2007/0285286 | A1 | 12/2007 | Hussain et al. |
| 2007/0285287 | A1 | 12/2007 | Hussain et al. |
| 2007/0296613 | A1 | 12/2007 | Hussain et al. |
| 2007/0297501 | A1 | 12/2007 | Hussain et al. |
| 2008/0069241 | A1 | 3/2008 | Kadono et al. |

OTHER PUBLICATIONS

Non-Final Office Action filed Jul. 8, 2008 for U.S. Appl. No. 11/760,247, U.S. Publication No. 2007-0297501.

Non-Final Office Action filed Jul. 16, 2008 for U.S. Appl. No. 11/760,274, U.S. Publication No. 2007-0296613.

Non-Final Office Action filed Jun. 30, 2008 for U.S. Appl. No. 11/759,431, U.S. Publication No. 2007-0285286.

* cited by examiner

DECODING OF CONTEXT ADAPTIVE VARIABLE LENGTH CODES IN COMPUTATIONAL CORE OF PROGRAMMABLE GRAPHICS PROCESSING UNIT

CROSS-REFERENCE TO RELATED APPLICATION

This application claims priority to copending U.S. provisional application entitled, "VARIABLE-LENGTH DECODING SYSTEMS AND METHODS," having Ser. No. 60/811,821, filed Jun. 8, 2006, which is incorporated herein by reference in its entirety.

TECHNICAL FIELD

The present disclosure is generally related to data processing systems, and more particularly, is related to programmable graphics processing systems and methods.

BACKGROUND

Computer graphics is the art and science of generating pictures, images, or other graphical or pictorial information with a computer. Many of the current graphics systems are implemented through the use of a set of interfaces, such as MICROSOFT's Direct3D interface, OpenGL, etc., that offer control of multimedia hardware (e.g., a graphics accelerator or graphics processing unit (GPU)) on a computer running a particular operating system, such as MICROSOFT WINDOWS, among others. The generation of the pictures or images is commonly called rendering, and the nuts and bolts of such operations are primarily implemented through a graphics accelerator. Generally, in three-dimensional (3D) computer graphics, geometry that represents surfaces (or volumes) of objects in a scene is translated into pixels (picture elements), stored in a frame buffer, and then displayed on a display device. Each object or group of objects may have specific visual properties related to the appearance of surfaces (materials, reflectance, shape, textures, etc.) which may be defined as a rendering context for this object or group of objects.

Consumer demand for increasing sophistication in controls and features for games and other multimedia products for which computer graphics are used, as well as the desire for more realism in generated images, engenders improvements in processing speed and power. Various standards have been developed to improve the visual quality of generated images while consuming fewer bits. One of these standards, the H.264 specification (also known as ISO Motion Picture Experts Group (MPEG)-4 part 10), is a high compression digital video codec standard. An H.264 compliant codec can encode video with approximately three times fewer bits than comparable MPEG-2 encoders while retaining similar video quality. The H.264 specification provides for two types of entropy encoding processes, including context-adaptive binary arithmetic coding (CABAC) and context-adaptive variable length coding (CAVLC). CAVLC is a context-adaptive variation of Huffman coding, where the probabilities of each symbol to encode changes depending on what kind of data is coded. CAVLC uses run-level coding to compactly represent strings of zeros, using such methods as signaling the number of high-frequency +/−1 coefficients and correlating the number of non-zero coefficients in neighboring blocks. Under CAVLC, syntax elements at or below the slice layer (e.g., quantized transform coefficients, such as from 8×8 or 4×4 transformations, or from secondary Hadamard transformations applied to DC coefficients of lower-level 4×4 transformations) are adaptively coded. Current CAVLC decoding architectures can meet at least some of the demands posed by consumers, but use a somewhat restrictive approach in design.

SUMMARY

Embodiments of context-adaptive variable length coding (CAVLC) decoding systems and methods (herein, also referred to as decoding systems) in a multithreaded parallel computational core of GPU are disclosed. Briefly described, in architecture, one embodiment of the system, among others, comprises a software programmable core processing unit having a context-adaptive variable length coding (CAVLC) unit configured to execute a shader, the shader configured to implement CAVLC decoding of a video stream and provide a decoded data output.

One embodiment of a method, among others, can be broadly summarized by the following steps: loading a shader to a programmable core processing unit having a context-adaptive variable length coding (CAVLC) unit, CAVLC decoding a video stream by executing the shader on the CAVLC unit, and providing a decoded data output.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of decoding systems and methods can be better understood with reference to the following drawings. The components in the drawings are not necessarily to scale, emphasis instead being placed upon clearly illustrating the principles of the systems and methods. Moreover, in the drawings, like reference numerals designate corresponding parts throughout the several views.

DETAILED DESCRIPTION

Figure 1:
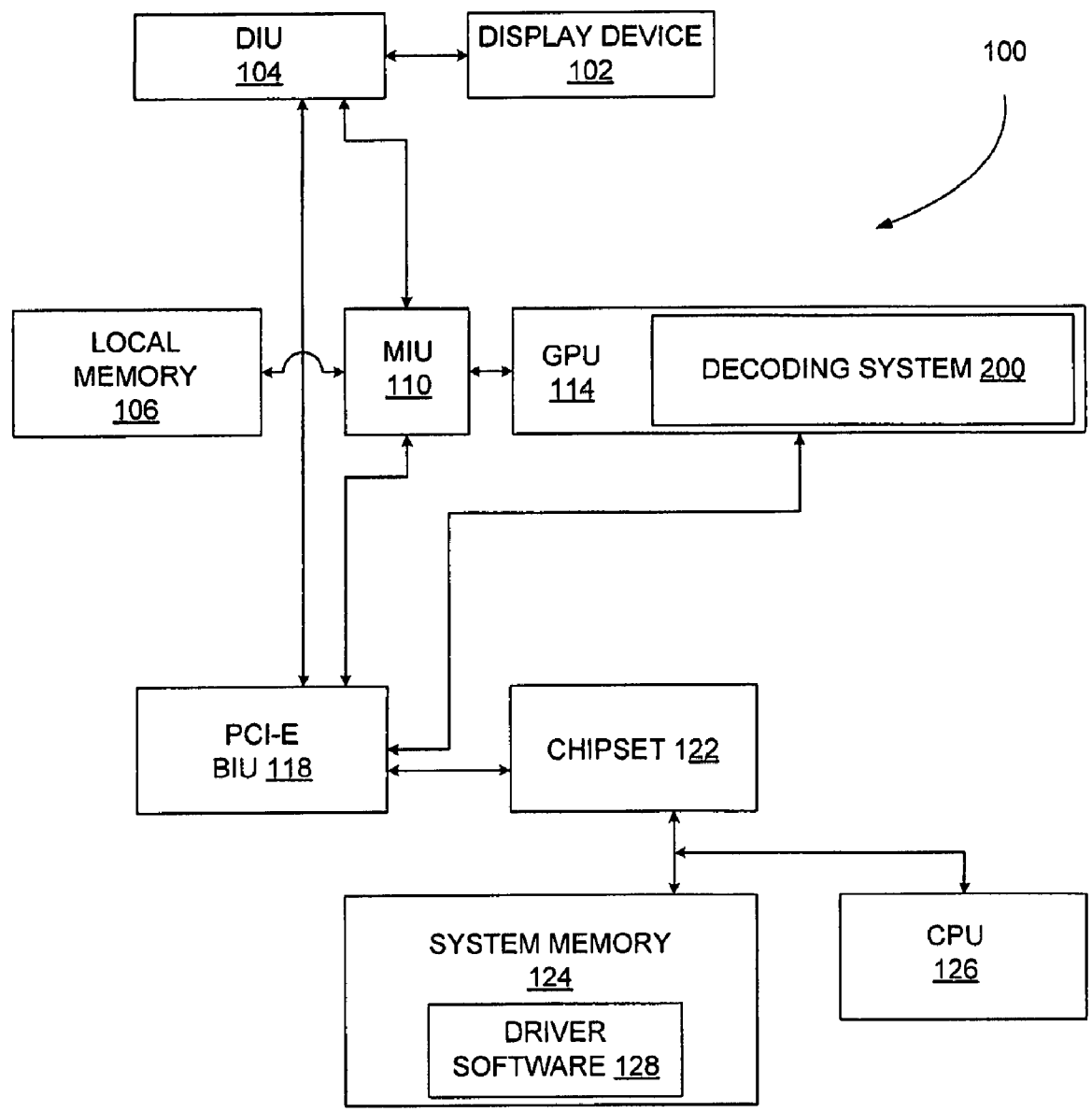
FIG. 1 is a block diagram of an embodiment of a graphics processor system in which various embodiments of decoding systems and (methods) are implemented.

Disclosed herein are various embodiments of context-adaptive variable length coding (CAVLC) decoding systems and methods (herein, also collectively referred to as decoding system(s)). In one embodiment, a decoding system is embedded in one or more execution units of a programmable, multithreaded, parallel computational core of a graphics processing unit (GPU). Decoding functionality is implemented using a combination of software and hardware. That is, video decoding is accomplished within the context of GPU programming, with the hardware implementation in a GPU data path. For instance, in one embodiment, decoding operations or methods are implemented by a shader (e.g., vertex shader) with an extended instruction set in cooperation with an execution unit data path of a GPU and additional hardware for the automatic management of a bitstream buffer in a CAVLC processing environment. Such an embodiment is in contrast to existing systems, which possess hardware-only or software-only based solutions to CAVLC processing, which limits implementation flexibility, among other limitations. For instance, a pure digital signal processor (DSP) or microprocessor-based implementation does not possess hardware for symbol decoding and bitstream management.

Additionally, the automatic bitstream buffer provides certain advantages. For instance, once the location (e.g., address) of the bitstream is made known to a direct memory access (DMA) engine of the bitstream buffer, the management of the bitstream is automatic and hence involves no further instructions. Such a mechanism is in contrast to conventional microprocessor/DSP systems, where bitstream management represents a large overhead cost. Further, the bitstream buffer mechanisms, through tracking of the number of bits consumed, enables the detection and handling of a corrupt bitstream.

Another benefit of the decoding system embodiments described herein pertains to the minimization of instruction latency. Since CAVLC decoding is very sequential and multi-threading is not easy to exploit, a type of forwarding mechanism (e.g., register forwarding) is employed in the various embodiments to reduce the effective dependency latency. Explaining further, a problem in many deep-pipelined, multi-threaded processors is that an instruction may not be executed every cycle out of the same thread. Some systems may employ general forwarding, which works by checking the address of the operands of the previous result and the instruction operand, and if the same, the result operands are used. Such general forwarding typically requires a complex set of comparing and multiplexing. In certain embodiments of decoding systems, a different type of forwarding is employed whereby bits in the instructions are used (e.g., one bit for each of the operands for a total of two bits) to encode whether the result of a previous computation (e.g., held in internal registers) should be used or should data in the source operands be used. Through this method, overall latency can be reduced while improving the efficiency of the processor pipeline.

The decoding systems described herein are capable of decoding bitstreams according to the well-known International Telecommunication Union Telecommunication Standardization Sector (ITU-T) H.264 standard. Various embodiments of the decoding systems operate based on the execution of one or more instruction sets received (e.g., via well known mechanisms such as preloading or through cache misses) from a GPU frame buffer memory or memory corresponding to a host processor (e.g., host central processing unit (CPU)).

FIG. 1 is a block diagram of an embodiment of a graphics processor system 100 in which embodiments of decoding systems and methods are implemented. In some implementations, the graphics processor system 100 may be configured as a computer system. The graphics processor system 100 may comprise a display device 102 driven by a display interface unit (DIU) 104 and local memory 106 (e.g., which may comprise a display buffer, frame buffer, texture buffer, command buffer, etc.). Local memory 106 may also be referred to interchangeably herein as a frame buffer or storage unit. Local memory 106 is coupled to a graphics processing unit (GPU) 114 through one or more memory interface units (MIU) 110. The MIU 110, GPU 114, and DIU 104 are coupled in one embodiment to a peripheral component interconnect express (PCIE) compatible bus interface unit (BIU) 118. In one embodiment, the BIU 118 may employ a graphics address remapping table (GART), although other memory mapping mechanisms may be employed. The GPU 114 includes the decoding system 200, as described below. Although shown as a component of the GPU 114, in some embodiments, the decoding system 200 may include one or more additional components of the graphics processor system 100 that are shown, or different components.

The BIU 118 is coupled to a chipset 122 (e.g., north bridge chipset) or switch. The chipset 122 comprises interface electronics to strengthen signals from a central processing unit (CPU) 126 (also referred to herein as a host processor) and to separate signals to and from a system memory 124 from those signals going to and from input/output (I/O) devices. Although a PCIE bus protocol is described, other manners of connection and/or communication between the host processor and the GPU 114 may be implemented in some embodiments (e.g., PCI, proprietary high-speed bus, etc.). The system memory 124 also comprises driver software 128, which communicates instruction sets or commands through the use of the CPU 126 to registers in the GPU 114.

Additional graphics processing units may be employed in some embodiments, coupled for instance to the components shown in FIG. 1 through the chipset 122 via a PCIE bus protocol among others. In one embodiment, the graphics processor system 100 may embody all of the components shown in FIG. 1, or fewer and/or different components than those shown in FIG. 1. Further, in some embodiments, additional components may be used, such as a south bridge chipset coupled to the chipset 122.

Figure 2:
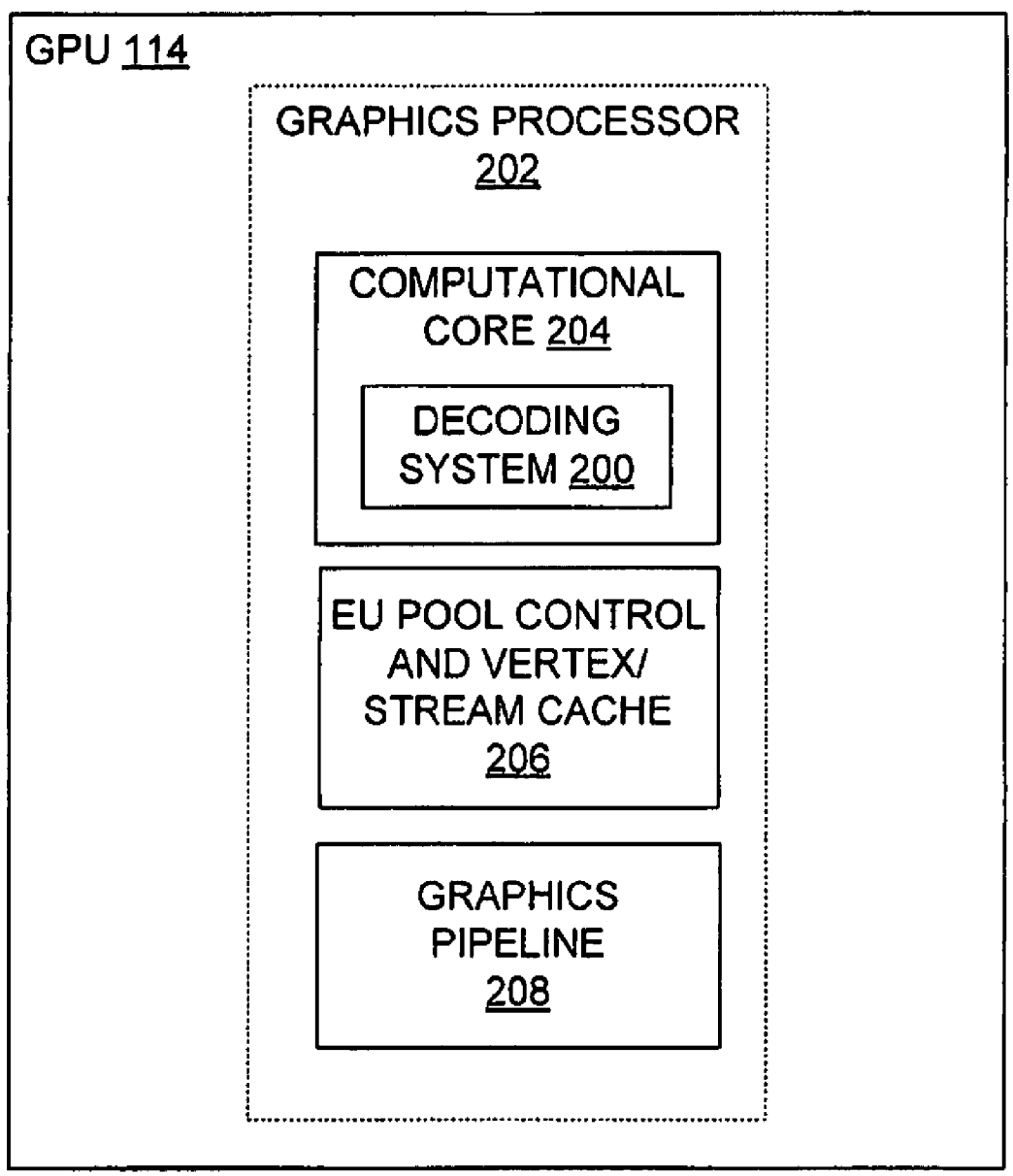
FIG. 2 is a block diagram that illustrates an exemplary processing environment in which various embodiments of decoding systems are implemented.

Reference is now made to FIG. 2, which is a block diagram that illustrates an exemplary processing environment in which an embodiment of a decoding system 200 is implemented. In particular, the GPU 114 is shown, and includes a graphics processor 202. The graphics processor 202 comprises a multiple execution unit (EU), computational core 204 (also known as software programmable core processing unit) that, in one embodiment, comprises the decoding system 200 (also known as context-adaptive variable length coding (CAVLC) unit) embedded in an execution unit data path (EUDP) distributed among one or more execution units. The graphics processor 202 also comprises an execution unit (EU) pool control and vertex/stream cache unit 206 (herein, EU pool control unit 206) and a graphics pipeline with fixed function logic 208 (e.g., including a triangle set-up unit (TSU), span-tile generator (STG), etc.) as explained below. The computational core 204 comprises a pool of multiple execution units to meet the computing requirements imposed by shader tasks associated with various shader programs, including a vertex shader, geometry shader, and/or pixel shader processing data for the graphics pipeline 208. As the functionality of the decoding system 200 in one embodiment is implemented largely through a shader of the computational core 204, a general description of an embodiment of a graphics processor 202 is described, followed by the particulars of certain embodiments of the decoding system 200.

The decoding system 200 can be implemented in hardware, software, firmware, or a combination thereof. In the preferred embodiment(s), the decoding system 200 is implemented in hardware and software, including any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), state machine, etc.

Figure 3:
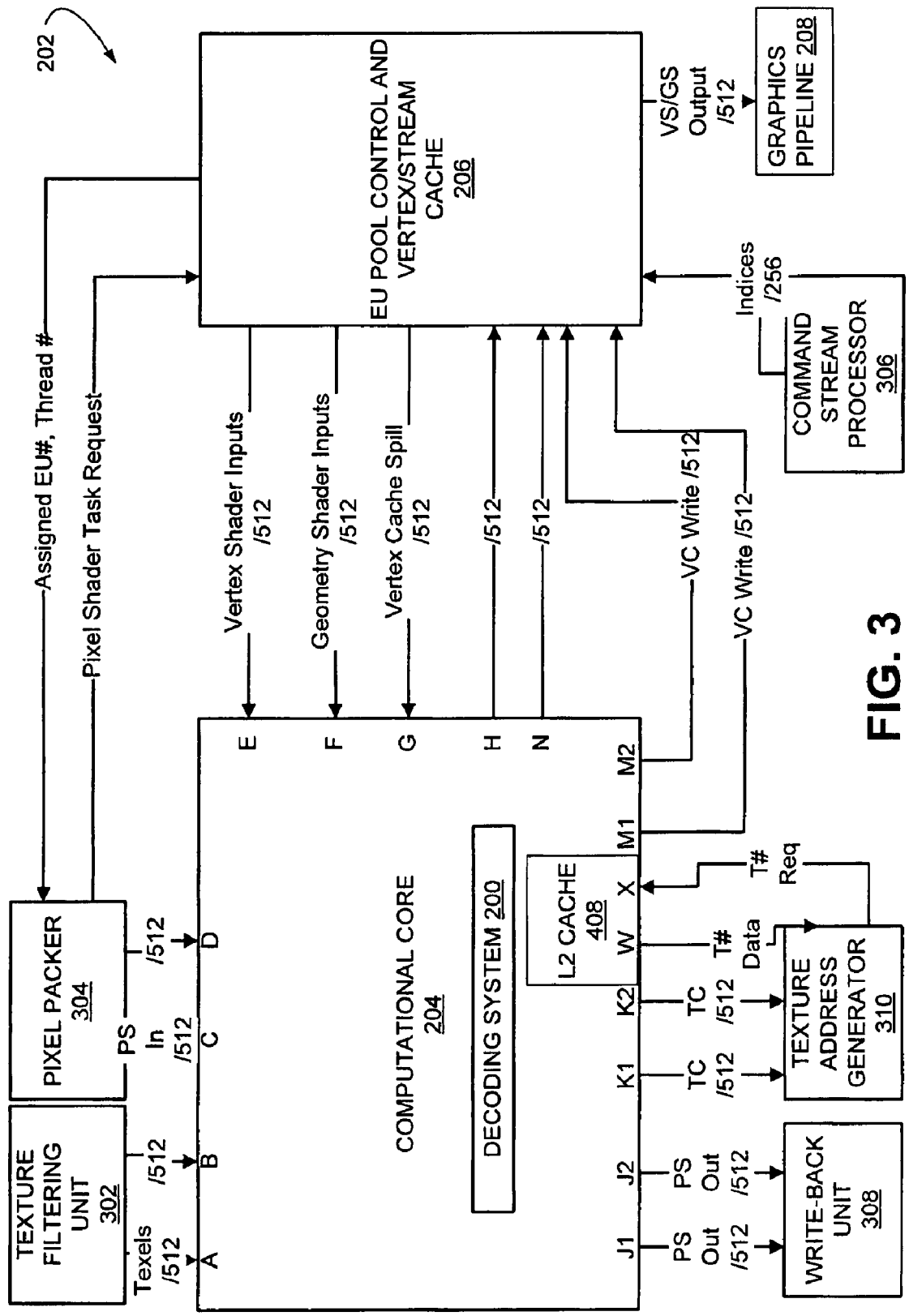
FIG. 3 is a block diagram that illustrates select components of the exemplary processing environment shown in FIG. 2.
Figure 4:
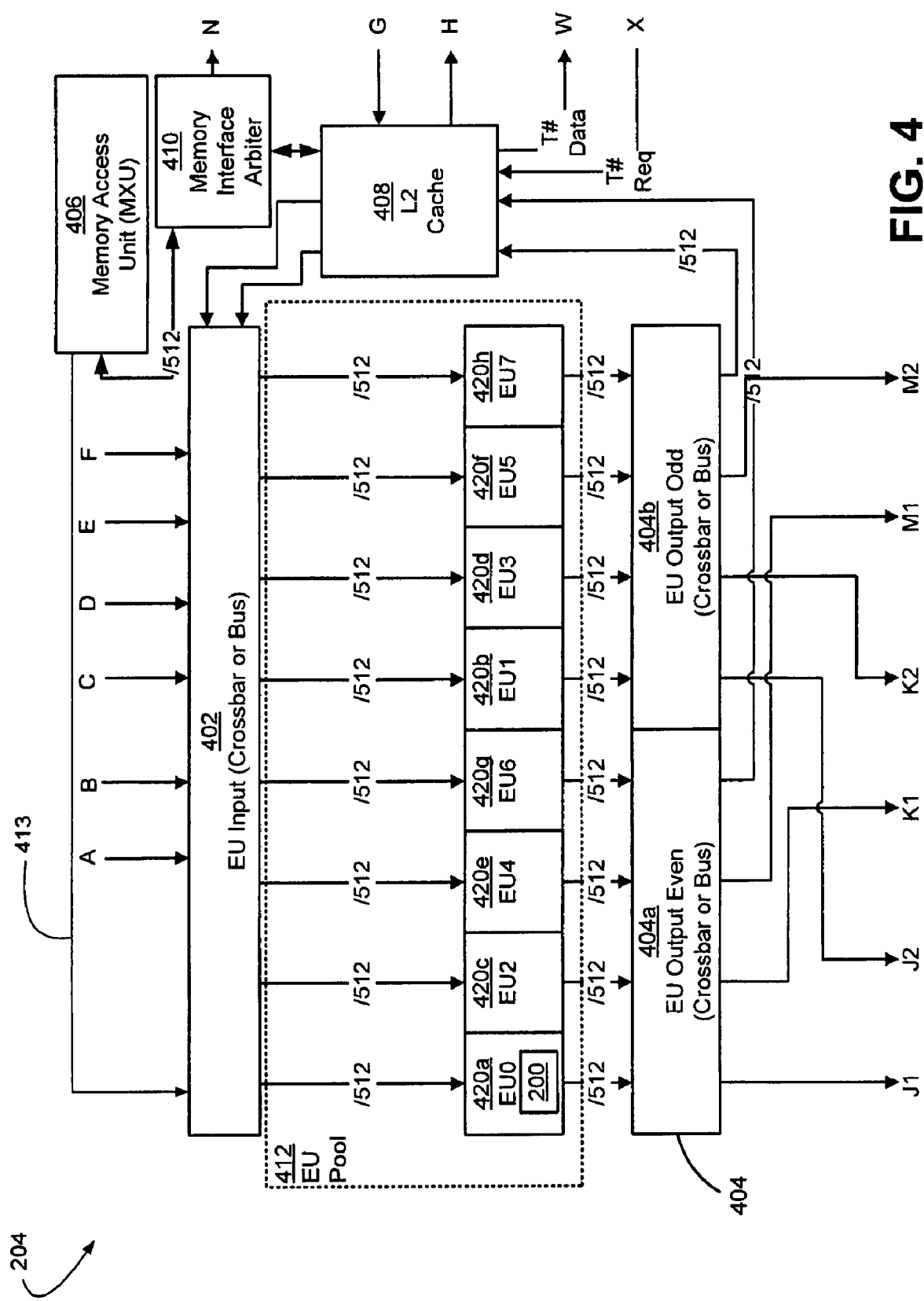
FIG. 4 is a block diagram that illustrates a computational core of the exemplary processing environment shown in FIGS. 2-3 in which various embodiments of decoding systems are implemented.

Reference is now made to FIGS. 3-4, which are block diagrams that each show select components of an embodiment of a graphics processor 202. As explained above, since one embodiment of a decoding system 200 can be implemented as a shader in the graphics processor 202 with an extended instruction set and additional hardware components, a general description of an embodiment of a graphics processor 202 and corresponding processing is described below. While not all components for graphics processing are shown, the components shown in FIGS. 3-4 should be sufficient for one having ordinary skill in the art to understand the general functions and architecture related to such graphics processors. Referring to FIG. 3, at the center of the programmable processing environment is a computational core 204, which processes various instructions and includes the decoding system 200. Various types of shader programs can be executed or mapped to the computational core 204, including vertex, geometry and pixel shader programs. The computational core 204, for multi-issue processors, is capable of processing multiple instructions within a single clock cycle.

As shown in FIG. 3, the relevant components of the graphics processor 202 comprise the computational core 204, a texture filtering unit 302, a pixel packer 304, a command stream processor 306, a write-back unit 308, and a texture address generator 310. Also included in FIG. 3 is the EU pool control unit 206, which also includes a vertex cache and/or a stream cache. As shown in FIG. 3, the texture filtering unit 302 provides texel data to the computational core 204 (inputs A and B). For some embodiments, the texel data is provided as 512-bit data.

The pixel packer 304 provides pixel shader inputs to the computational core 204 (inputs C and D), also in 512-bit data format. Additionally, the pixel packer 304 requests pixel shader tasks from the EU pool control unit 206, which provides an assigned EU number and a thread number to the pixel packer 304. Since pixel packers and texture filtering units are known in the art, further discussion of these components is omitted here. While FIG. 3 shows the pixel and texel packets as 512-bit data packets, it should be appreciated that the size of the packets can be varied for some embodiments, depending on the desired performance characteristics of the graphics processor 202.

The command stream processor 306 provides triangle vertex indices to the EU pool control unit 206. In the embodiment of FIG. 3, the indices are 256-bits. The EU pool control unit 206 assembles vertex shader inputs from the stream cache and sends data to the computational core 204 (input E). The EU pool control unit 206 also assembles geometry shader inputs and provides those inputs to the computational core 204 (input F). The EU pool control unit 206 also controls an EU input 402 (FIG. 4) and an EU output 404 (FIG. 4). In other words, the EU pool control unit 206 controls the respective inflow and outflow to the computational core 204.

Upon processing, the computational core 204 provides pixel shader outputs (outputs J1 and J2) to the write-back unit 308. The pixel shader outputs include color information, such as red/green/blue/alpha (RGBA) information, which is known in the art. The pixel shader output may be provided as two 512-bit data streams. Other bit-widths may also be implemented in some embodiments.

Similar to the pixel shader outputs, the computational core 204 outputs texture coordinates (outputs K1 and K2), which include UVRQ information, to the texture address generator 310. The texture address generator 310 issues a texture descriptor request (T# Req) to an L2 cache 408 of computational core 204 (input X), and the L2 cache 408 of computational core 204 outputs (output W) the texture descriptor data (T# data) to the texture address generator 310. Since the various examples of the texture address generator 310 and the write-back unit 308 are known in the art, further discussion of those components is omitted here. Again, while the UVRQ and the RGBA are shown as 512 bits, it should be appreciated that this parameter may also be varied for some embodiments. In the embodiment of FIG. 3, the bus is separated into two 512-bit channels, with each channel holding the 128-bit RGBA color values and the 128-bit UVRQ texture coordinates for four pixels.

The graphics pipeline 208 comprises fixed-function graphics processing functionality. Responsive to a command from the driver software 128, such as to draw a triangle, vertex information is passed to vertex shader logic in the computational core 204 to implement vertex transformations. In particular, objects are transformed from object space to work space and screen space as triangles. The triangles are passed from the computational core 204 to a triangle set-up unit (TSU) in the graphics pipeline 208, which assembles primitives, and also performs known tasks such as bounding box generation, culling, edge function generation, and triangle level rejections, among other known functions. The TSU passes data to a span and tile generation unit of the graphics pipeline 208, which provides tile generation functionality, whereby the data objects are segmented into tiles (e.g., 8×8, 16×16, etc.) and passed to another fixed function unit configured to perform depth (e.g., z-value) processing, such as high level (e.g., where fewer bits are consumed than similar processing at a lower level) rejection of z-values. The z-values are passed back to pixel shader logic in the computational core 204 for the performance of pixel shader functionality based on received texture and pipelined data. The computational core 204 outputs processed values to destination units located in the graphics pipeline 208. The destination units are configured to perform alpha testing and stencil testing before values in various caches need to be updated.

Note that the L2 cache 408 of the computational core 204 and the EU pool control unit 206 also transfer to each other 512-bit vertex cache spill data. Additionally, two 512-bit vertex cache writes are output from the computational core 204 (outputs M1 and M2) to the EU pool control unit 206 for further handling.

Referring to FIG. 4, additional components of the computational core 204 and related components are shown. The computational core 204 comprises an execution unit (EU) pool 412, which in one embodiment comprises one or more execution units (EUs) 420a through 420h (collectively referred to herein as EUs 420). Each of the EUs 420 is capable of processing multiple instructions within a single clock cycle. Thus, the EU pool 412, at its peak, can process multiple threads simultaneously or substantially simultaneously. While eight (8) EUs 420 are shown in FIG. 4 (labeled EU0 through EU7), it should be appreciated that the number of EUs need not be limited to eight, but may be greater or fewer in number for some embodiments. At least one of the execution units, for instance EU0 420a, comprises an embodiment of the decoding system 200, as explained further below.

The computational core 204 also comprises a memory access unit 406 that is coupled to the L2 cache 408 through a memory interface arbiter 410. The L2 cache 408 receives vertex cache spill (input G) from the EU pool control unit 206 and provides vertex cache spill (output H) to the EU pool control unit 206. Additionally, the L2 cache 408 receives texture descriptor T# requests (input X) from the texture address generator 310, and provides the texture descriptor T# data (output W) to the texture address generator 310 in response to the received request.

The memory interface arbiter 410 provides a control interface to the local video memory (e.g., frame buffer or local memory 106). The BIU 118 provides an interface to the system through, for example, a PCIE bus. The memory interface arbiter 410 and BIU 118 provide the interface between the memory and the L2 cache 408. For some embodiments, the L2 cache 408 connects to the memory interface arbiter 410 and the BIU 118 through the memory access unit 406. The memory access unit 406 translates virtual memory addresses from the L2 cache 408 and other blocks to physical memory addresses.

The memory interface arbiter 410 provides memory access (e.g., read/write access) for the L2 cache 408, fetching of instructions/constants/data/texture, direct memory access (e.g., load/store), indexing of temporary storage access, register spill, vertex cache content spill, etc.

The computational core 204 further comprises an EU input 402 and an EU output 404, which are respectively configured to provide the inputs to the EU pool 412 and receive the outputs from the EU pool 412. The EU input 402 and the EU output 404 may be crossbars or buses or other known input mechanisms.

The EU input 402 receives the vertex shader input (E) and the geometry shader input (F) from the EU pool control unit 206, and provides that information to the EU pool 412 for processing by the various EUs 420. Additionally, the EU input 402 receives the pixel shader input (inputs C and D) and the texel packets (inputs A and B), and conveys those packets to the EU pool 412 for processing by the various EUs 420. Additionally, the EU input 402 receives information from the L2 cache 408 (L2 read) and provides that information to the EU pool 412 as needed.

The EU output 404 in the embodiment of FIG. 4 is divided into an even output 404a and an odd output 404b. Similar to the EU input 402, the EU output 404 can be crossbars or buses or other known architectures. The even EU output 404a handles the output from the even EUs 420a, 420c, 420e, 420g, while the odd EU output 404b handles the output from the odd EUs 420b, 420d, 420f, 420h. Collectively, the two EU outputs 404a, 404b receive the outputs from the EU pool 412, such as the UVRQ and the RGBA. Those outputs, among others, may be directed back to the L2 cache 408, or output from the computational core 204 to the write-back unit 308 through J1 and J2 or output to the texture address generator 310 through K1 and K2.

The execution unit flow of the EU pool 412 generally comprises several levels, including a rendering context level, thread or task level, and an instruction or execution level. At any given time, there may be two rendering contexts allowed in each execution unit 420, with the contexts identified by the use of a one bit flag or other mechanisms. The context information is passed from the EU pool control unit 206 before tasks belonging to this context are commenced. Context level information may include shader type, number of input/output registers, instruction starting address, output mapping table, vertex identifier, and constants in a respective constant buffer. Each execution unit 420 of the EU pool 412 may store a plurality of tasks or threads (e.g., in some embodiments, thirty-two threads) at the same time. In one embodiment, each thread fetches an instruction according to a program counter.

The EU pool control unit 206 functions as global scheduler for the tasks and assigns appropriate threads in the execution units 420, using a data-driven approach (e.g., vertex, pixel, geometry packet in the input). For instance, the EU pool control unit 206 assigns a thread to one of the empty thread slots in the respective execution unit 420 of the EU pool 412. Data fed by a vertex cache or other component or module (depending on the shader type) is placed in a common register buffer, after which execution of a thread may commence.

In general, an embodiment of the graphics processor 202 utilizes programmable vertex, geometry, and pixel shaders. Rather than implementing the functions or operations of these components as separate fixed function units with different designs and instruction sets, the operations are instead executed by the pool of execution units 420a, 420b . . . 420n with a unified instruction set. Each of these execution units 420, except EU 420a (which, though programmable, comprises the decoding system 200 and thus has added functionality) is identical in design and configurable for programmed operation. In one embodiment, each execution unit 420 is capable of multi-threaded operations simultaneously. As various shader tasks are generated by the vertex shader, geometry shader, and pixel shader, they are delivered to the respective execution units 420 to be carried out. The decoding system 200 may be implemented in one embodiment using a vertex shader, with some modifications and/or differences from other execution units 420. For instance, one difference between an execution unit embodying the decoding system 200, such as the execution unit 420a, and the other execution units (e.g., 420b of FIG. 4), is that data for the decoding system 200 is received from the MXU 406 via connection 413 and the EU input 402, due in part to the management by the decoding system 200 of one or more corresponding internal buffers.

As individual tasks are generated, the EU pool control unit 206 handles the assigning of those tasks to available threads within the various execution units 420. As tasks are completed, the EU pool control unit 206 further manages the release of the relevant threads. In this regard, the EU pool control unit 206 is responsible for assigning vertex shader, geometry shader, and pixel shader tasks to threads of the various execution units 420, and also performs an associated "bookkeeping" of the tasks and threads. Specifically, the EU pool control unit 206 maintains a resource table (not specifically illustrated) of threads and memories for all execution units 420. The EU pool control unit 206 particularly knows which threads have been assigned tasks and are occupied, which threads have been released after thread termination, how many common register file memory registers are occupied, and how much free space is available for each execution unit.

Accordingly, when a task is assigned to one execution unit (e.g., 420a), the EU pool control unit 206 will mark the thread as busy and subtract the total available common register file memory by the amount of the appropriate register file footprint for each thread. This footprint is set or determined by states for the vertex shader, geometry shader, and pixel shader. Further, each of the shader stages may have different footprint sizes. For example, a vertex shader thread may require ten (10) common register file registers, while a pixel shader thread may only require five such registers.

When a thread completes its assigned task(s), the execution unit 420 running the thread sends an appropriate signal to the EU pool control unit 206. The EU pool control unit 206, in turn, updates its resource table to mark the thread as free and to add the amount of total thread common register file space back to the available space. When all threads are busy or all the common register file memory has been allocated (or there is too little register space remaining to accommodate an additional thread), then the execution unit 420 is considered full and the EU pool control unit 206 will not assign any additional or new threads to that execution unit.

A thread controller is also provided inside each of the execution units 420, and this thread controller is responsible for managing or marking each of the threads as active (e.g., executing) or available. In this regard, at least in one embodiment, the EU pool control unit 206 can prohibit the geometry shader and pixel shader from running at the same time as the vertex shader when the vertex shader is executing functionality of the decoding system 200.

Figure 5A:
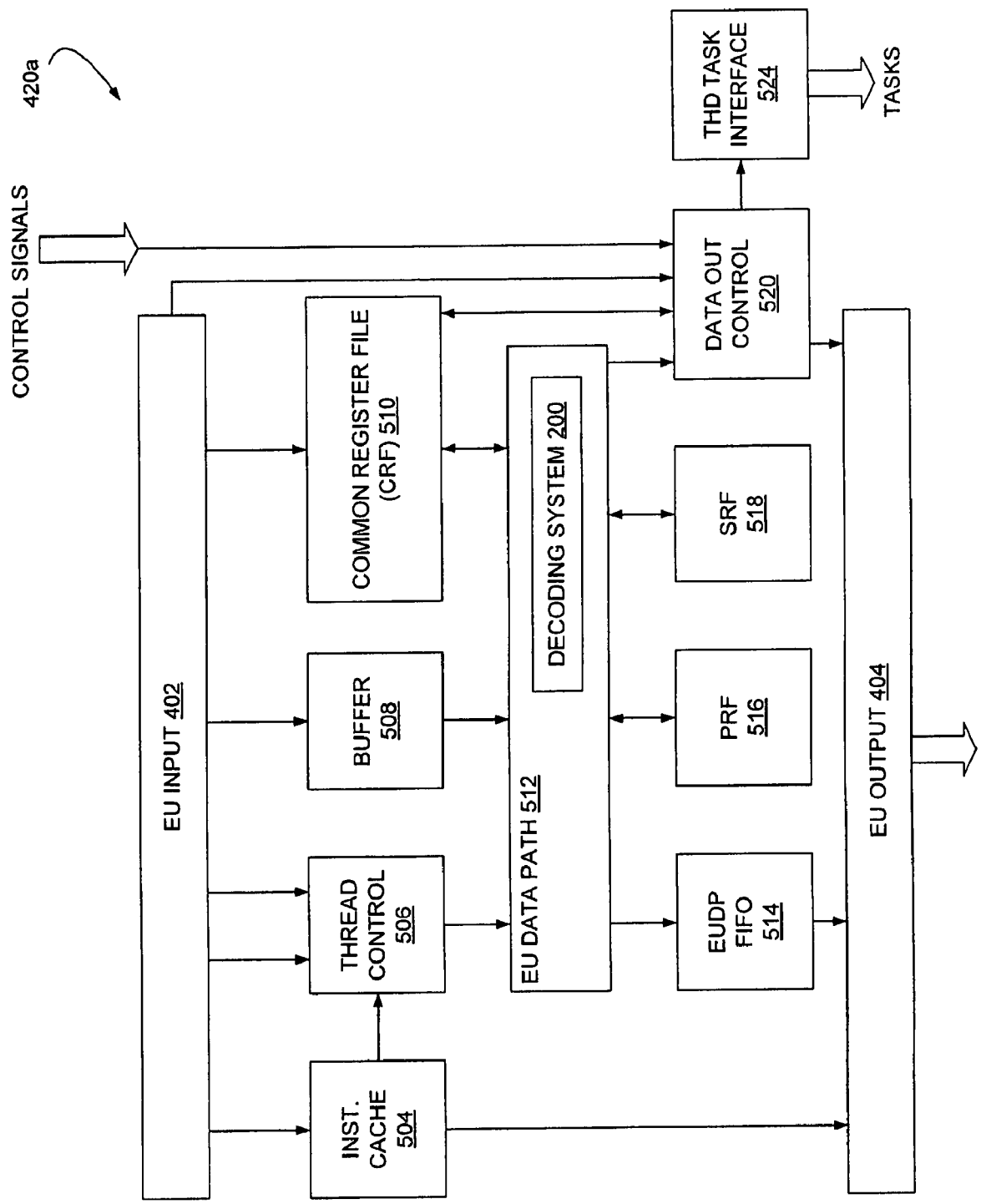
FIG. 5A is a block diagram that illustrates select components of an execution unit of the computational core shown in FIG. 4 in which various embodiments of decoding systems are implemented.

Having described various features of an embodiment of a graphics processor 202 and computational core 204, an embodiment of the execution unit 420a including an EU data path in which the decoding system 200 is embedded is now described in association with FIG. 5A. In particular, FIG. 5A is a block diagram of the execution unit 420a, which in one embodiment, comprises an instruction cache controller 504, a thread controller 506 coupled to the instruction cache controller 504, a buffer 508 (e.g., constant buffer), a common register file (CRF) 510, an EU data path (EUDP) 512 coupled to the thread controller 506, buffer 508, and CRF 510, an EUDP FIFO 514, a Predicate Register File (PRF) 516, a Scalar Register File (SRF) 518, a data out controller 520, and a thread task interface 524. As explained above, the execution unit 420a receives input from EU input 402 and provides an output to EU output 404.

The thread controller 506 provides control functionality for the entire execution unit 420a, with functionality including the management of each thread and decision-making functionality such as determining how threads are to be executed. The EUDP 512 comprises the decoding system 200, as explained further below, and in general, comprises functionality for performing various calculations, and includes such logic as floating point and integer arithmetic logic units (ALUs), shift logic functionality, among other logic.

The data out controller 520 comprises functionality to move finished data to certain components connected to the EU output 404, such as the vertex cache of the EU pool control unit 206, write back unit 308, etc. The EUDP 512 passes "end of task" information to the data out controller 520, notifying the same that a task is completed. The data out controller 520 comprises storage for the completed task (e.g., 32 entries), as well as a plurality of write ports. The data out controller 520 selects tasks from storage, and reads out all output data items in register locations specified by a shader rendering-context from the CRF 510 and sends data to the EU output 404.

The thread task interface 524 sends out task identifiers that are completed in the execution unit 420a to the EU pool control unit 206. That is, the task identifiers provide notification to the EU pool control unit 206 that a thread resource in a particular execution unit, for instance 420a, is available for a new task assignment.

In one embodiment, the constant buffer 508 may be divided up into 16 blocks, with each block having 16 slots with 128-bit horizontal vector constants in each. A constant buffer slot is accessed in a shader using an operand and index, wherein the index may be a temporary register comprising, for example, a 32-bit unsigned integer or an immediate 32-bit unsigned integer constant.

The instruction cache controller 504 is an interface block to the thread controller 506. When there is a thread controller read request (e.g., to fetch executable shader code from instruction memory), the instruction cache controller 504 preferably performs a hit/miss test by looking up a tag table (not shown). For example, a hit occurs when a requested instruction is in a cache of the instruction controller 504. A miss occurs when this requested instruction is to be fetched from the L2 cache 408 or memory 106. If a hit occurs, the instruction cache controller 504 grants the request if there is no request from the EU input 402 because the instruction cache of the instruction cache controller 504 has 1RW port limitation and the EU input 402 has higher priority. Otherwise, if a miss occurs, the instruction cache controller 504 grants the request when there is a replaceable block in the L2 cache 408 and there is space in the pending request EUDP FIFO 514. In one embodiment, the cache of the instruction cache controller 504 comprises 32 sets, with four blocks per set. Each block carries a 2-bit status signal to indicate three (3) states of invalid, loading, or valid. A block is "invalid" before being loaded with L2 data, becomes "loading" when waiting for L2 data, and becomes "valid" after L2 data loads in.

The predicate register file (PRF) 516 is read from and written to by the EUDP 512. The EU input 402 serves as an interface for incoming data to the execution unit 420a. In one embodiment, the EU input 402 comprises an 8-entry FIFO to buffer the incoming data. The EU input 402 also comprises functionality to pass data to the instruction cache of the instruction cache controller 504 and the constant buffer 508. The EU input 402 also maintains shader contexts.

The EU output 404 serves as an interface for outgoing data from the execution unit 420a into the vertex cache of the EU pool control unit 206, the L2 cache 408, and the write back unit 308. In one embodiment, the EU output 404 comprises a 4-entry FIFO to receive arbitrated requests and to buffer the data for the EU pool control unit 206. The EU output 404 comprises various functionality, including functionality to arbitrate the request from an instruction cache read request, data out write request, and EUDP read/write request.

The CRF 510 is used to store input, output, and temporary data. In one embodiment, the CRF 510 comprises eight (8) banks with 1R1W and 1RW ports of a 128×128-bit register file. The 1R+1W ports are used by the EUDP 512 for read and write access initiated by instruction execution. Banks 0, 2, 4, and 6 are shared among even numbered threads and banks 1, 3, 5, and 7 are shared among odd numbered threads. The thread controller 506 pairs instructions from different threads and ensures that there is no read or write bank conflict on the CRF memories.

The 1RW port is used by the EU input 402 and data out controller 520 for loading the initial thread input data and writing the final thread output to the EU pool control unit data buffers and L2 cache 408 or other modules. The 1RW I/O port is shared by both the EU input 402 and EU output 404, and write in one embodiment has higher priority than read. The 512-bits of the input data goes to four different banks to avoid any conflict when loading data into the CRF 510. A 2-bit channel index is passed in along with the data and 512-bit aligned base address to specify the starting bank of the input data. For example, if the starting channel index is 1, then the first 128-bit from the least significant bit (LSB) is loaded into bank 1, the next into bank 2, . . . etc., and the last into bank 0, assuming the thread based bank offset is 0. Note the two LSBs of the thread ID are used to generate a bank offset to randomize the starting bank location for each thread.

The CRF register index along with the thread ID can be used to construct a unique logical address for tag matching in reading and writing data in the CRF 510. For instance, the address may be aligned to 128 bits, the width of the CRF bank. Thirteen (13) bits of the address may be constructed from combining the 8-bit CRF register index and the 5-bit thread ID to create a unique address. Each 1024-bit line has a tag, and there are two 512-bit entries (words) on each line. Each word is stored across four banks and the two LSBs of the CRF index are added to the bank offset of current thread to create the bank selection.

The tag matching scheme allows the registers of different threads to share the CRF 510 to make good utilization of the memory, since the EU pool control unit 206 keeps track of memory usage of the CRF 510 and ensures there is enough space before scheduling a new task to the execution unit 420*a*.

The destination CRF index is checked against the size of the total CRF registers for a current thread. The input data is expected to be present in the CRF 510 before the thread controller 506 commences the thread and shader execution begins. The output data is read from the CRF 510 by the data out controller 520 after thread execution ends.

Figure 5B:
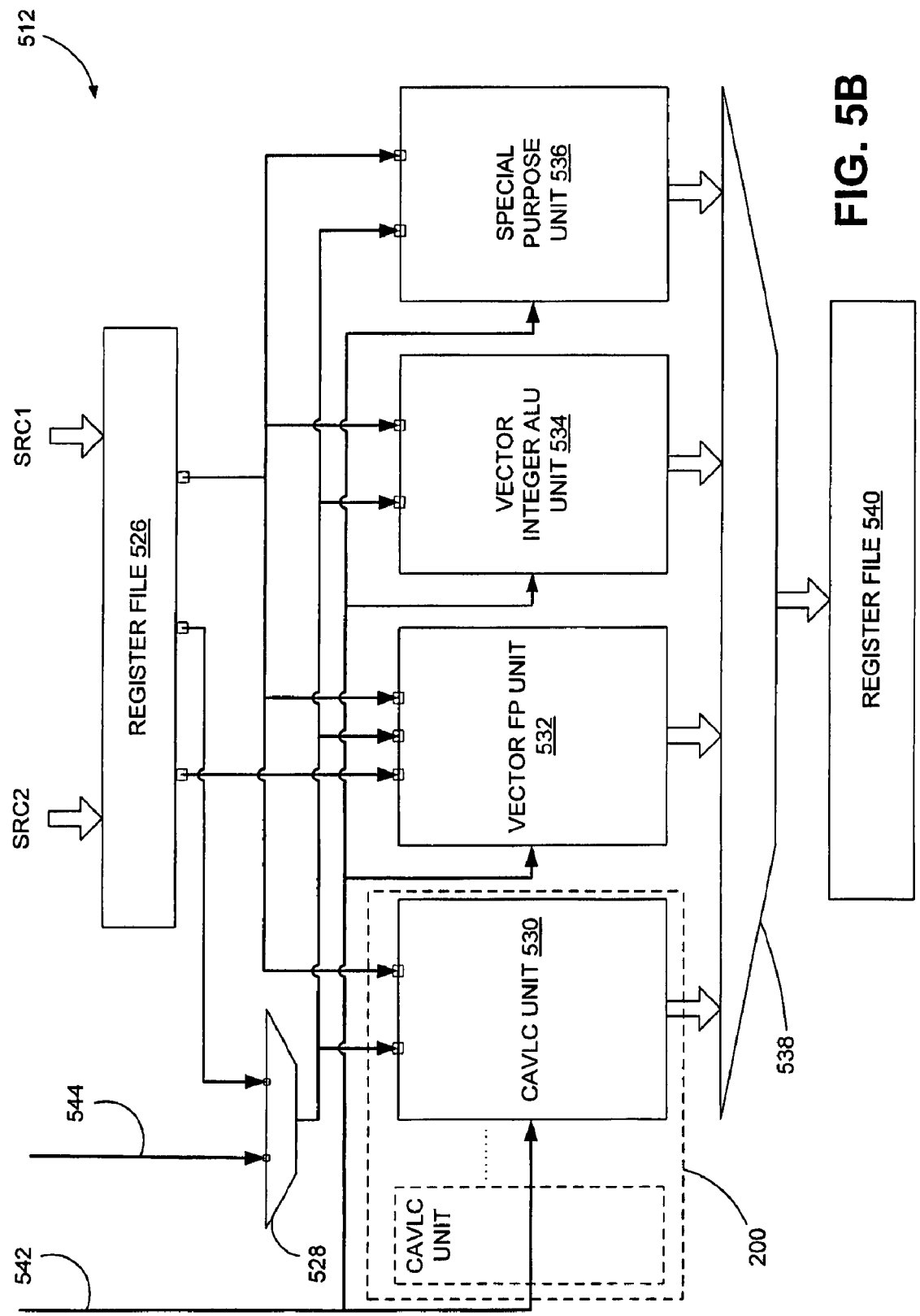
FIG. 5B is a block diagram of an execution unit data path in which various embodiments of decoding systems are implemented.

Having described an embodiment of an execution unit 420*a* comprising an EUDP 512 in which an embodiment of the decoding system 200 is implemented, an embodiment of the EUDP 512 is shown in FIG. 5B and described as follows. The EUDP 512 comprises a register file 526, a multiplexer 528, a vector floating point (FP) unit 532, a vector integer ALU 534, a special purpose unit 536, a multiplexer 538, a register file 540, and the decoding system 200. The decoding system 200 comprises one or more CAVLC units 530, resulting in the ability to decode one or more streams. For instance, a single CAVLC unit 530 enables the decoding of a single stream, two CAVLC units 530 (e.g., one shown in phantom but without connections for brevity) enables the simultaneous decoding of two streams, etc. For purposes of illustration, the below description addresses the operations of the decoding system 200 using a single CAVLC unit 530, with the understanding that the principles can be similarly applied to more than one CAVLC unit.

As shown, the EUDP 512 comprises a number of parallel datapaths corresponding to the CAVLC decoding unit 530, vector floating point unit 532, vector integer ALU 534, and special purpose unit 536, each of which executes a corresponding operation based on the received instruction. Operands (denoted SRC1 and SRC2) are received at the register file 526, the latter of which in one embodiment may correspond to the CRF 510, PRF 516, and/or SRF 518 shown in FIG. 5A. Note that in some embodiments, additional operands may be used. Operation (function) signal line 542 provides a medium for the receipt of operation signals to be received at each respective unit 530-536. Immediate signal line 544, coupled to the multiplexer 528, carries an immediate value encoded into instructions for use by each unit 530-536 in carrying out integer operations on small integer values. The operands, operation (function) signals, and immediate signals are provided by an instruction decoder (not shown). The multiplexer 538 at the end of the datapaths (which may comprise a writeback phase) selects a result of the correct datapath that is selected and provides an output to the register file 540. The output register file 540 comprises a destination, and may be the same component as the register file 526 or a different register. Note that in embodiments where the source and destination register comprise the same component, bits are provided in the instructions with source and destination selects that are used by the multiplexer to multiplex the data to/from the appropriate register file.

Hence, the execution unit 420*a* may be viewed as a multi-stage (e.g., four (4)-stage pipeline, with four arithmetic logic units (ALUs)), and CAVLC decoding operations occur within the four execution phases. Stalls are implemented as needed to allow CAVLC decoding threads to be executed. For instance, stalls may be incorporated in the execution of the stages when there is an underflow in a bitstream buffer, when waiting for context memory to be initialized, when waiting for the bitstream to be loaded into a FIFO buffer and sREG register (explained below), and/or generally when processing time has exceeded a predetermined threshold of time.

In some embodiments, the decoding system 200 is configured for the simultaneous decoding of two bit streams using a single execution unit 420*a*. For instance, the decoding system 200 can employ two data paths (e.g., with the addition of another CAVLC unit 530) to perform simultaneous two-stream decoding according to an extended instruction set, although fewer or greater streams may be decoded (and hence fewer or greater data paths may be utilized) at one time. Certain embodiments of the decoding system 200 are not limited to simultaneous decoding when multiple streams are involved. Further, in some embodiments, a single CAVLC unit 530 may implement multiple simultaneous decoding of streams.

In embodiments where the decoding system 200 employs two data paths, two threads may run at the same time. For instance, in a two-stream decoding embodiment, the number of threads are limited to two, with a first thread (e.g., thread0) assigned to a first bank (i.e., CAVLC unit 530) of the decoding system 200 and a second thread (e.g., thread1) assigned to a second bank (e.g., the CAVLC unit shown in phantom in FIG. 5B) of the decoding system 200. In some embodiments, two or more threads may be run on a single bank. In some embodiments, the decoding system 200, though shown as embedded within the EUDP 512, may comprise additional components, such as logic in the EU pool control unit 206.

Having described certain embodiments of the execution unit 420*a*, the EUDP 512, and the CAVLC unit 530, a brief explanation of the decoding system 200 in the context of H.264 CAVLC operations is provided below. As is known, the CAVLC process encodes a level (e.g., magnitude) of a signal pertaining to a macroblock or portion thereof and how often (e.g., how many cycles) that level is repeated (e.g., the run), avoiding the need to encode every bit. Such information is received at and parsed from a bitstream buffer, where the buffer is replenished as the information is consumed by a decoding engine of the decoding system 200. The decoding system 200 inverses the encoding process by extracting the macroblock information comprising the level and run coefficients from the received bitstream and reconstructing the signal. Thus, the decoding system 200 receives the macroblock information from the bitstream buffer, and parses out the stream to obtain level and run coefficient values for temporary storage in level and run arrays, respectively. These level and run arrays are read out, for instance, as 4×4 blocks of pixels corresponding to a block in a macroblock, and then the level and run arrays are cleared for the next block. The entire macroblock can be constructed in software based on the 4×4 building blocks according to the H.264 standard.

Now that the general operations involved in decoding macroblock information has been provided, the following description sets forth an explanation of the various components of the decoding system 200 in the context of the CAVLC decoding process, with the understanding that variations consistent with accepted practices of the standard are contemplated. It should be appreciated by one having ordinary skill in the art in the context of this disclosure that many of the terms used below (for example, as labels for various parameters) can be found in the H.264 specification, and hence explanation of the same is omitted for brevity except where helpful to the understanding of the various processes and/or components described below.

Figure 6A:
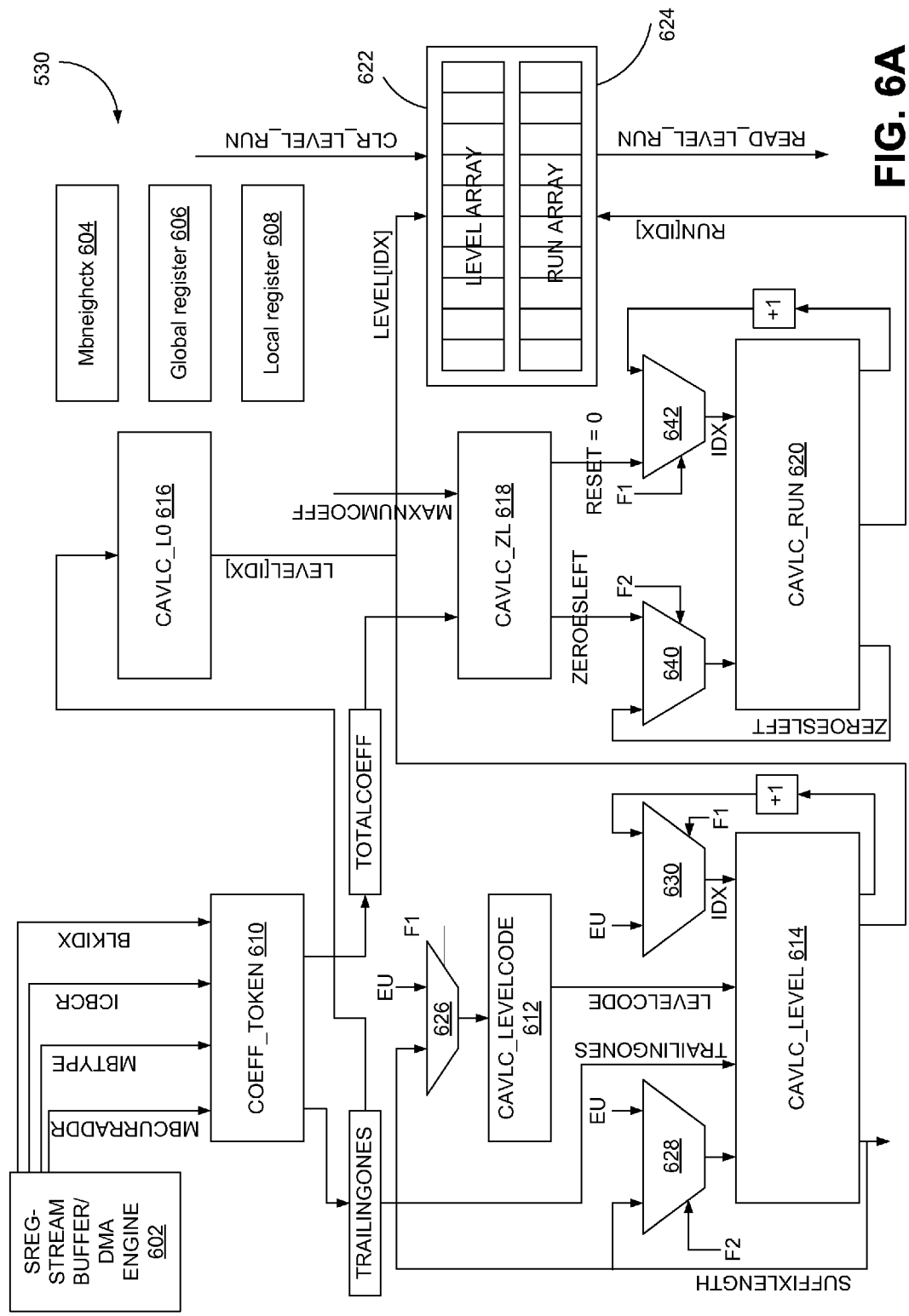
FIG. 6A is a block diagram of a decoding system embodiment as shown in FIG. 5B.
Figure 6B:
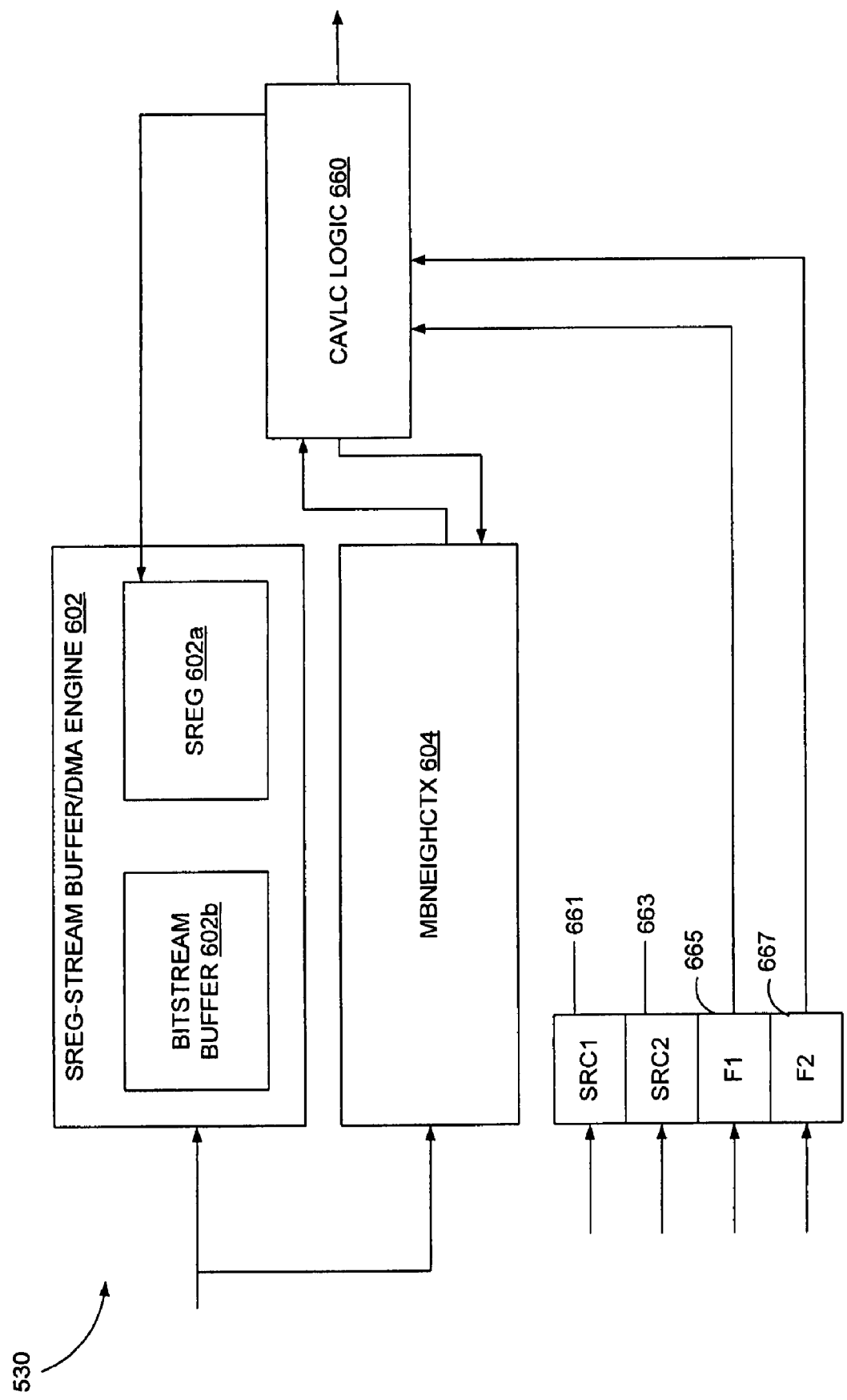
FIG. 6B is a block diagram of an embodiment of a bitstream buffer of the decoding system shown in FIG. 6A.
Figure 6C:
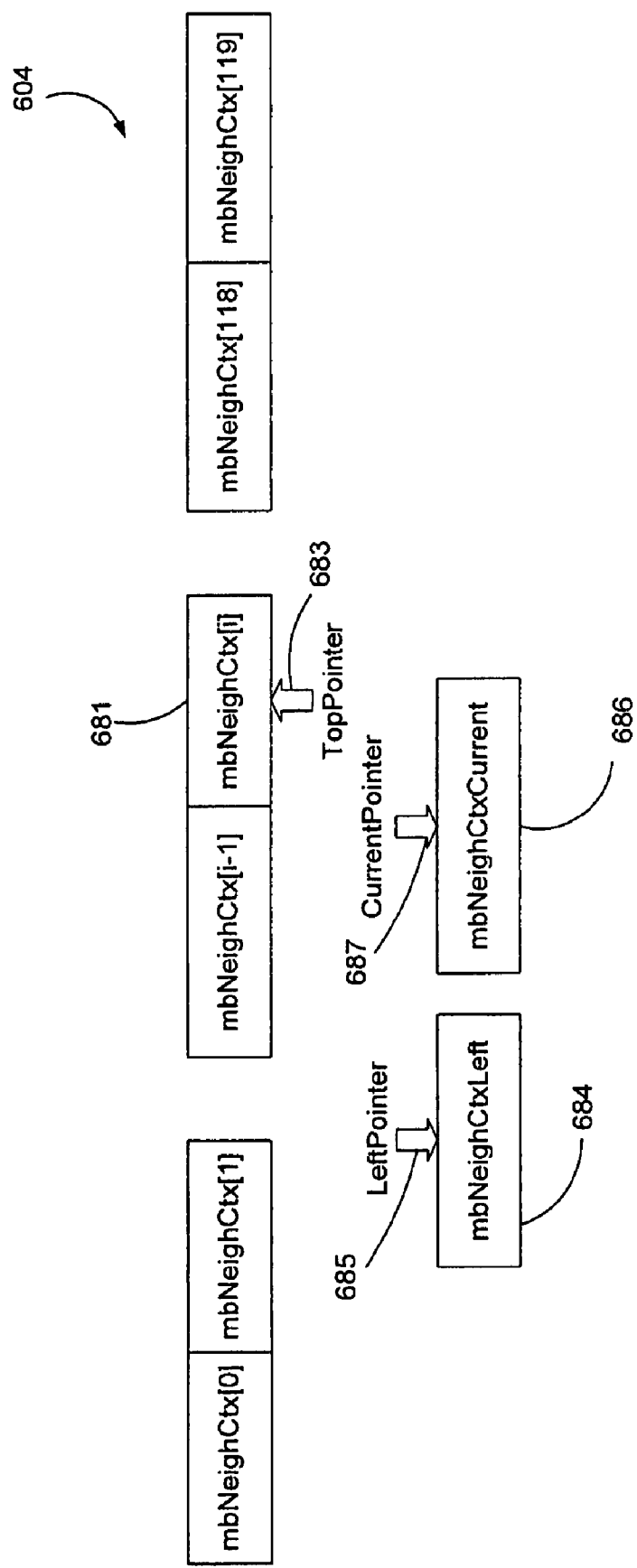
FIG. 6C is a block diagram of an embodiment of a context memory structure and associated registers of the decoding system of FIG. 6A.
Figure 6D:
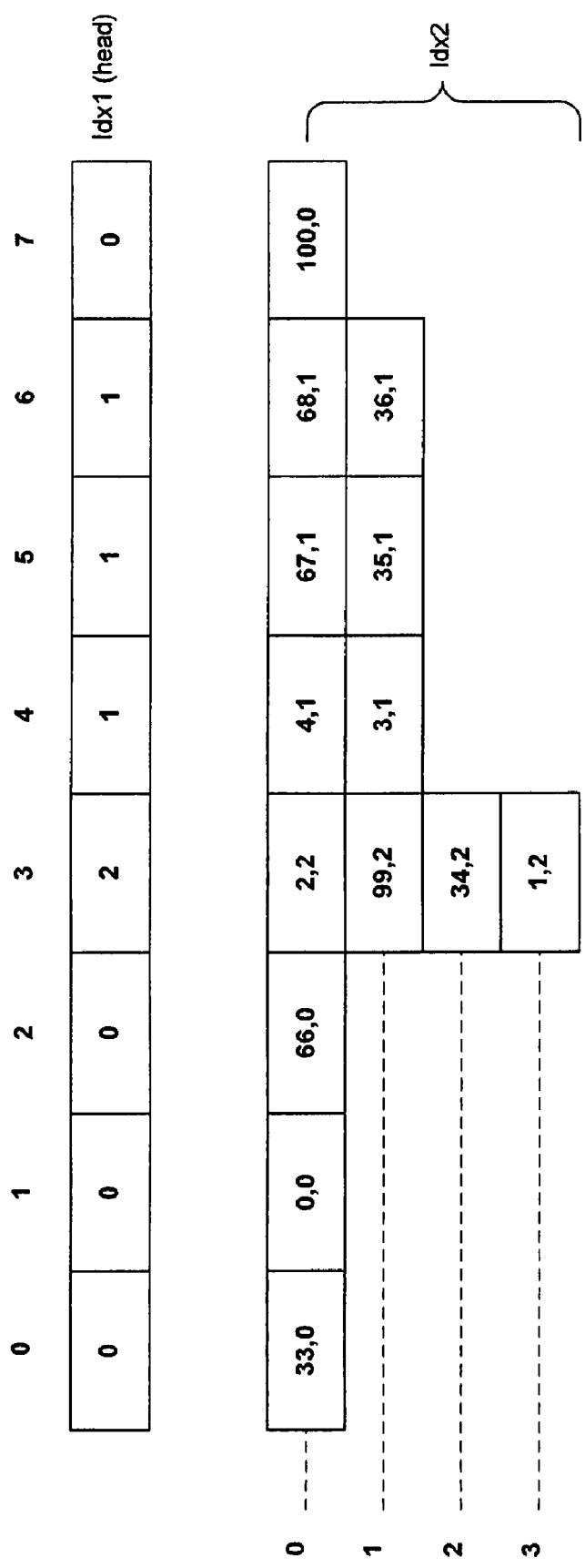
FIG. 6D is a block diagram of an embodiment of a table structure used by the decoding system of FIG. 6A for context-adaptive variable length coding (CAVLC) decoding.

FIGS. 6A-6C are block diagrams that illustrate certain embodiments of a decoding system 200. A single CAVLC unit 530 is shown associated with the decoding system 200 (with the CAVLC unit 530 and the decoding system 200 used interchangeably below in association with FIGS. 6A-6C), and hence the decoding system 200 is configured to decode a single bitstream in the illustrated embodiment. Similar principles apply to decoding systems 200 with additional CAVLC units used to simultaneously decode multiple (e.g., two) streams. Briefly, FIG. 6A illustrates select components of the CAVLC unit 530; FIG. 6B illustrates stream buffer functionality provided by the CAVLC unit 530; FIG. 6C illustrates context memory (e.g., including registers) functionality of the CAVLC unit 530; and FIG. 6D illustrates a table structure for CAVLC decoding. It should be appreciated that although the below description is set forth in the context of macroblock decoding, the principles set forth herein may also apply to variations in block decoding.

Referring to FIG. 6A, the CAVLC unit 530 comprises several modules of hardware, including a coefficient token module (coeff_token) 610, a level code module (CAVLC_LevelCode) 612, a level module (CAVLC_Level) 614, a level0 module (CAVLC_L0) 616, a zero level module (CAVLC_ZL) 618, a run module (CAVLC_Run) 620, a levelArray (LevelArray) 622, and a run array (RunArray) 624. Also included in the decoding system is an SREG-stream buffer/DMA engine 602 (shown also in FIG. 6B, and also referred to herein as a DMA engine module), global register 606, local register 608, and mbNeighCtx memory 604 (e.g., in one embodiment, comprising a 96-bit register that can be regarded as three logical 32-bit registers for writing from a shader), shown also in FIG. 6C, in addition to other registers not shown.

The CAVLC unit 530, at its interface to the rest of the execution unit 420a, includes one or more destination buses and corresponding register(s) (e.g., DST registers) and source buses and corresponding registers (SRC1, SRC2, etc.). The data on the destination buses may be communicated, directly or indirectly (e.g., through an intermediary cache, register(s), buffers, or memory), to a video processing unit internal or external to the GPU 114. The data on the destination bus may be formatted in one of a plurality of different formats, including DX API formats of MICROSOFT, among others. Such data may include coefficients, macroblock parameters, motion information, and/or IPCM samples, among other data. The CAVLC unit 530 also includes a memory interface that comprises an address bus and data bus, as should be appreciated by one having ordinary skill in the art in the context of the present disclosure. The memory interface enables access to bitstream data by providing an address via the address bus for access to data received on the data bus. In one implementation, data on the data bus may include a non-encrypted video stream comprising various signal parameters, among other data and formats. In some embodiments, a load-store operation can be used to provide access to the bitstream data.

Before commencing description of the various components of the CAVLC unit 530, a brief overview is presented that relates CAVLC decoding to the overall operation of the execution unit 420a. In general, based on the slice type, the driver software 128 (FIG. 1) prepares and loads a CAVLC shader to the execution unit 420a. The CAVLC shader uses standard instruction sets plus additional instruction sets, labeled for purposes of this disclosure in a manner that mirrors the module that executes the instruction, including coeff_token, CAVLC_LevelCode, CAVLC_Level, CAVLC_L0, CAVLC_ZL, and CAVLC_Run instructions to decode a bitstream. Additional instructions include READ_LRUN and CLR_LRUN pertaining to read and clear operations on the LevelArray 622, and RunArray 624. In one embodiment, the first instructions executed by the CAVLC shader include an INIT_CAVLC and INIT_ADE before other instructions are issued. These two latter instructions, explained further below, initialize the CAVLC unit 530 to decode a CAVLC bitstream and load the bitstream into a FIFO buffer from which point stream decoding is managed automatically. Thus, the CAVLC unit 530 provides for parsing of a bitstream, initialization of the decoding hardware and register/memory structures, and level-run decoding. Each of the aforementioned functionality for the H.264 CAVLC decoding process is described further below, beginning with the bitstream buffer operations.

With regard to the parsing of the bitstream, the bitstream is received at the memory interface over a data bus and buffered at the SREG-stream buffer/DMA engine 602. Bitstream decoding is provided from the stage of slice data parsing. That is, a bitstream, such as an NAL bitstream, comprises one or more pictures that are broken-up into a picture header and slices. A slice generally refers to a sequence of macroblocks. In one embodiment, an external process (i.e., external to the CAVLC unit 530) parses the NAL bitstream, decoding the slice header and passing on the pointer to the location of the slice data (e.g., where the slice starts). Generally, the driver software 128 processes the bitstream from the slice data level as expected by application and API processes. The passing along of the pointer to the location of the slice data involves the address of the first byte of the slice data (e.g., raw-byte sequence payload (RBSP) byte address, or herein RBSP-byteAddress) and a bit offset indicator (e.g., one or more bits) to indicate the position of the start or head of the bitstream (e.g., sREGptr). This initialization of the bitstream is explained further below. In some embodiments, the external process may be implemented by a host processor (e.g., CPU 126, FIG. 1) to provide for picture-level decoding and slice-header decoding. For instance, in some embodiments, the decoding system 200 parses the H.264 bitstream from the picture level, and CAVLC decoding operations are implemented on the basis of the slice data and macroblock level. In some embodiments, due to the programmable nature of the CAVLC unit 530, decoding may be implemented at any level.

Referring to FIG. 6B, shown is a block diagram that illustrates select component parts of the SREG-stream buffer/DMA engine 602 and other components of the CAVLC unit 530, including operand registers 661 and 663 for receiving SRC1 and SRC2 values, respectively, and forwarding registers 665 and 667. The CAVLC logic 660 refers to the modules and components shown in FIG. 6A, absent the SREG-stream buffer/DMA engine 602, mbNeighCtx memory 604, global register 606, and local register 608. The SREG-stream buffer/DMA engine 602 comprises an internal bitstream buffer 602b that in one embodiment includes a 32-bit register and eight 128-bit (8×128) registers configured in, for instance, BigEndian format. The SREG-stream buffer/DMA engine 602 is initially set-up through the driver software 128 issuing an initialization instruction as explained below. Once initiated, the internal buffer 602b of the SREG-stream buffer/DMA engine 602 is largely managed automatically. The SREG-stream buffer/DMA engine 602 is used to maintain the location of the bits to be parsed.

Explaining further, the SREG-stream buffer/DMA engine 602 in one embodiment uses two registers, a fast 32-bit flip-flop and slower 512 or 1024 bit memory. The bitstream is consumed in bits. The sREG register 602a (herein, also simply sREG) operates on the bit level and the bitstream buffer 602b on the byte level, which helps to save on power. In general, instructions operate on the sREG 602a and consume a few bits (e.g., 1-3 bits). When more than one byte of data has been consumed from the sREG 602a, then data (in byte chunks) is provided to the sREG 602a from the bitstream buffer 602b, and a buffer pointer is decremented by the number of bytes transferred. When 256-bits or more have been consumed, then the DMA of the SREG-stream buffer/DMA engine 602 detects this event, and fetches 256-bit from memory to refill the bitstream buffer 602b. Thus, a simple circular buffer (256-bit chunks×4) is implemented by the CAVLC unit 530 to keep track of the bitstream buffer 602b and provide replenishment. In some embodiments, a single buffer may be used, however typically at the expense of implementing a circular buffer with more complex pointer arithmetic at the speed of the memory.

In particular, interaction with the internal buffer 602b may be accomplished through the use of an initialization instruction, herein referred to as an INIT_BSTR instruction. In one embodiment, the INIT_BSTR instruction is issued (e.g., by the driver software 128) at about the same time as the INIT_CAVLC (or_ADE) instruction and causes a stall until the bitstream data comes into the buffer 602b. Once the data arrives in the buffer 602b, the stall is removed and the rest of the processing can start. After this point, the DMA engine of the SREG-stream buffer/DMA engine 602 continues to prefetch bitstream data into the buffer 602b if the fullness of the buffer goes below a predefined threshold. Given the byte address and the bit-offset of the bitstream location, the INIT_BSTR instruction loads the data into the internal bitstream buffer 602b and starts the process of managing it. For each call to process slice data, the following instruction with the following format is issued:

INIT_BSTR offset, RBSPbyteAddress

This instruction is issued to load the data into the internal buffer 602b of the SREG-stream buffer/DMA engine 602. The byte address (RBSPbyteAddress) may be provided via the SRC2 register 663 and the bit offset via the SRC1 register 661, as one example. Thus, one generic instruction format may be provided as follows:

INIT_BSTR SRC2, SRC1, where SRC1 and SRC2 in this instruction, and others provided below, correspond to values within internal registers 661 and 663, though not limited to these registers. The memory fetch used to access the bitstream data, in one embodiment, is 256-byte aligned, which is written into buffer registers and transferred to the 32-bit sREG register 602a of the SREG-stream buffer/DMA engine 602. In one implementation, data in the bitstream buffer 602b is byte-aligned before any other operations on these registers or buffers can be performed. The alignment of the data may be implemented through the use of an alignment instruction, referred to herein as an ABST instruction. The ABST instruction aligns the data in the bitstream buffer 602b, where alignment bits (e.g., stuffed bits) are eventually discarded during the decoding process.

As data is consumed from the sREG register 602a, it is replenished by the internal buffer 602b. In other words, the internal buffer 602b of the SREG-stream buffer/DMA engine 602 acts as a circular buffer of modulo three that feeds the 32-bit register 602a of the SREG-stream buffer/DMA engine 602. The CAVLC unit 530 (e.g., the CAVLC logic 660) may utilize a READ instruction to read data from the sREG register 602a. The READ instruction may have the following format:

READ DST, SRC1, where DST corresponds to an output or destination register. In one embodiment, the SRC1 register 661 comprises an unsigned integer value, n. That is, under the READ instruction, n-bits are read from the sREG register 602a. When 256-bits of data are consumed (e.g., when one or more syntax elements are decoded) from the 32-bit sREG register 602a, a fetch is automatically initiated to get another 256-bits of data to write to registers in the internal buffer 602b for subsequent entry into the sREG register 602a for consumption.

In some embodiments, if the data in the sREG register 602a corresponding to a symbol decode has been consumed to a pre-defined number of bits or bytes, and no data has been received in the internal buffer 602b, the CAVLC logic 660 can implement a stall, enabling the execution of another thread (e.g., a thread unrelated to CAVLC decoding processing), such as for a vertex shader operation.

The operations of the DMA engine of the SREG-stream buffer/DMA engine 602 minimize total buffer requirements to compensate for memory latency (e.g., can be 300 plus cycles in some graphics processor units). As a bitstream is consumed, requests are made to stream-in further bitstream data. If the bitstream data is low and the bitstream buffer 602b at risk of underflow (e.g., given the number of cycles for signals to flow from the CAVLC unit 530 to the processor pipeline), stall signals can be passed to the processor pipe to cause a halt in operations until data arrives in the bitstream buffer 602b.

Additionally, the SREG-stream buffer/DMA engine 602 inherently provides an ability to handle a corrupted bitstream. For instance, it is possible that, due to corruption of the bitstream, end-of-slice markers may not be detected. Such failure in detection can result in a completely wrong decode result and consumption of bits from future pictures or slices. The SREG-stream buffer/DMA engine 602 keeps track of the number of bits consumed. If the number of bits consumed is larger than a defined (e.g., programmable per slice) amount or threshold, then processing stops and an exception signal is sent to the processor (e.g., host processor). Code can then be executed on the processor to attempt to recover from the corruption.

Two other instructions pertaining to bitstream access include the INPSTR and INPTRB instructions. The INPSTR and INPTRB are used to detect whether special patterns (e.g., data start or end patterns) are present in the slice, macroblock, etc., enabling a read of the bitstream without progressing the bitstream. The sequence of instructions, in one embodiment, comprises the implementation of the INPSTR, INPTRB, and then the READ instruction. The INPSTR instruction comprises the following exemplary format:

INPSTR DST, which in one embodiment inspects the bitstream and returns the most significant 16-bits of SREG register 602a in the lower 16-bits of a destination (DST) register. The upper 16-bits of a destination register contains the value of sREGbitptr. The data is not removed from the sREG register 602a as a result of this operation. This instruction can be implemented according to the following exemplary pseudocode:

```
MODULE   INPSTR (DST)
OUTPUT [31:0] DST
DST = {ZE (sREGbitptr), sREG [msb: msb–15]};
ENDMODULE
```

Another instruction pertaining to the bitstream is the INPTRB instruction, which inspects the raw byte sequence payload (RBSP) trailing bits (e.g., the byte-aligned bitstream). The INPTRB instruction provides for the reading of the bitstream buffer 602b. One exemplary format can be expressed as follows:

INPTRB DST.

In the INPTRB operation, no bits are removed from the sREG register 602a. If the most significant bits of the sREG register 602a contains, for instance, 100, then it consists of the RBSP stop bit, and the remaining bits in the byte are alignment zero bits. This instruction can be implemented according to the following exemplary pseudocode:

```
MODULE INPTRB(DST)
OUTPUT DST;
REG [7:0] P;
P = sREG [msb: msb–7];
Sp = sREGbitptr;
T [7:0] = (P >> sp) << sp;
DST [1] = (T == 0x80)? 1: 0;
DST[0] = ! (CVLC_BufferBytesRemaining > 0);
ENDMODULE
```

The READ instruction provides for the alignment of the data in the bitstream buffer 602.

Now that the bitstream buffer operations of the CAVLC unit 530 have been described, attention is now directed to the initialization of CAVLC operations and, in particular, the initialization of memory and register structures and the decoding engine (e.g., CAVLC logic 660). At the start of a slice, and before decoding a syntax element corresponding to a first macroblock, register structures, global register 606, local register 608, and the CAVLC decoding engine are initialized. In one embodiment, this initialization is performed upon issuance by the driver software 128 using an INIT_CAVLC instruction. The INIT_CAVLC instruction may be implemented according to the following exemplary instruction format:

INIT_CAVLC SRC2, SRC1, where:

SRC2 comprises the number of bytes to be decoded in the slice data. This value is written to an internal CVLC_bufferBytesRemaining register;

```
SRC1 [15:0] = mbAddrCurr,
   SRC1 [23:16] = mbPerLine,
   SRC1 [24] = constrained_intra_predflag,
   SRC1 [27:25] = NAL_unit_type (NUT),
```

SRC1 [29:28]=chroma_format_idc (one embodiment uses a chroma_format_idc value of one (1) corresponding to a 4:2:0 format, although other sampling mechanisms may be used in some embodiments), and SRC1 [31:30]=Undefined.

With regard to the INIT_CAVLC instruction, the value in SRC1 is written to the corresponding fields in the global register 606. Further, the value in SRC2 is written to an internal register (e.g., CVLC_bufferByteRemaining) set-up by the INIT instructions. The CVLC_bufferByteRemaining register is used to recover from any corrupted bitstream, as explained above. For instance, at the start of decoding, the CAVLC unit 530 (e.g., the SREG-stream buffer/DMA engine 602) records information pertaining to the buffered bits in the bitstream for a given slice. As the bitstream is consumed, the CAVLC unit 530 counts and updates the CVLC_bufferByteRemaining value. If this value goes below zero, the below-zero value is an indication that the buffer or bitstream is corrupted, prompting the termination of processing and the return to application control or control by the driver software 128 to handle recovery.

Referring to FIG. 6C, the INIT_CAVLC instruction also initializes the various storage structures of the CAVLC unit 530, including the mbNeighCtx memory 604 and registers mbNeighCtxLeft 684 and mbNeighCtxCurrent 686. The mbNeighCtx memory 604 comprises a macroblock-based neighborhood context memory arranged in one embodiment as a memory array to store data relating to a row of macroblocks. Register mbNeighCtxCurrent 686 is configured to store a currently decoded macroblock, and register mbNeighCtxLeft 684 is configured to store a previously decoded, neighboring (left) macroblock. Associated with mbNeighCtx memory 604 and registers mbNeighCtxLeft 684 and mbNeighCtxCurrent 686 are pointers represented symbolically as arrows in FIG. 6C, including top pointer 683, left pointer 685, and current pointer 687, respectively. To decode a current macroblock, the decoded data is stored in mbNeighCtxCurrent 686. Given the contextual nature of CAVLC decoding, decoding of the current macroblock is based on information gleaned by the CAVLC_TOTC instructions from previously decoded macroblocks, namely the left macroblock stored in mbNeighCtxLeft 684 and pointed to by left pointer 685 and the top macroblock stored in the array element (referenced as "i") 681 and pointed to by top pointer 683.

The INIT_CAVLC instruction is used to initialize the top and left pointers 683 and 685 pertaining to macroblocks adjacent to the current macroblock (e.g., elements in the array of mbNeighCtx 604). For instance, the left pointer 685 may be set to zero (0) and the top pointer 683 at mbPerLine may be set to one (1). Additionally, the INIT_CAVLC instruction updates the global register 606.

In one embodiment, the mbNeighCtx memory 604 comprises an array having 120 elements, including elements mbNeighCtx[0], mbNeighCtx[1], . . . mbNeighCtx[119] for a maximum of 120 macroblocks per picture width. Note that the mbNeighCtx memory 604 is shown with 120 elements (e.g., for HDTV having 1920×1080 pixel elements) for illustrative purposes, and that one having ordinary skill in the art should appreciate that other array structures of differing element quantities can be used in some embodiments.

To determine whether an adjacent macroblock (e.g., left neighbor) is present (i.e., valid), an operation (e.g., mbCurrAddr % mbPerLine) may be performed by the CAVLC_TOTC instruction to check whether the result is zero. In one embodiment, the following computation may be performed:

$$a = (mbCurrAddr \% mbPerLine)$$

$$a = mbCurrAddr - \left\lfloor \frac{mbCurrAddr}{mbPerLine} \right\rfloor \times mbPerLine$$

Note that mbCurrAddr refers to the current macroblock location corresponding to the binary symbols to be decoded, and mbPerLine refers to the amount of macroblocks per a given row. The above computation is implemented, in one embodiment, using one divide, one multiply, and one subtract.

As one example illustration, consider the following:
mbCurrAddr ∈[0:max MB−1], with maxMB being 8192 and mbPerLine=120. The divide can be performed with a multiply with (1/mbPerLine) being looked up in a table (e.g., a 120×11-bit table) stored in on-chip memory. If mbCurrentAddr is, say, 13-bits, a 13×11-bit multiplier may be used. In one embodiment, the result of this multiply is rounded, the upper 13-bits are stored, and 13×7-bit multiply is performed, whereby the lower 13-bits are stored. Finally, a 13-bit subtract operation is performed to determine "a." The entire sequence of operations may take two (2) cycles, and the result may be stored to be utilized in other operations, and computed once when the mbCurrAddr value changes.

In some embodiments, the modulo computation is not performed, but instead, shader logic in the execution unit (e.g., EU 420*a*, 420*b*, etc.) is used to supply the first mbAddrCurr value aligned to lie in the first line of the slice. For example, such shader logic may perform the following calculation: mbAddrCurr=absoluteMbAddrCurr−n*mbPerLine.

The contents of the mbNeighCtx memory 604 may be "moved" using CWRITE instructions. One exemplary format for the CWRITE instruction can be expressed as follows:
CWRITE SRC1, where SCR1 [15:0]=mbAddrCurr. The CWRITE instruction also copies the appropriate fields from the register mbNeighCtxCurrent 686 to the mbNeighCxt[1] 681 (top) of mbNeighCtx[ ] structure 604 and mbNeighCtx[I−1]. When (mbAddrCurr % mbPerLine==0), then mbNeighCtxLeft 684 is marked as being unavailable (e.g., it is initialized to zero). The contents of the mbNeighCtx memory 604, local register 608, and global register 606 may be "moved" using CWRITE instructions. For instance, the CWRITE instructions move the relevant content of mbNeighCtx memory 604 to the left and top block of the i$_{th}$ macroblock (e.g., mbNeighCtx[i] or current macroblock), and also clears the mbNeighCtx register 686. That is, as explained above, associated with the mbNeighCtx memory 604 are two pointers: left pointer 685 and top pointer 683. After a CWRITE instruction, the top index is incremented by one and the content of the current macroblock is moved to the top position and also to the left position in the array 604. The aforementioned organization may reduce the number of read/write ports on this memory array to one read/write.

The contents of the mbNeighCtx register 604, local register 608, and global register 606 may be updated using INSERT instructions. One exemplary format that can be used for the INSERT instruction can be expressed as follows:
INSERT DST,#lmm, SRC1

In the above INSERT instruction, one embodiment for #lmm comprises a 10-bit number, with the first 5-bit the width of the data, and the upper 5-bit specifies the position where the data is to be inserted. Input parameters include the following:
Mask=NOT(0xFFFFFFFF<<#lmm[4:0])
Data=SRC1 & Mask
SDATA=Data<<#lmm[9:5]
SMask=Mask<<#lmm[9:5]

The output, DST, can be represented as follows:

DST=(DST & NOT(sMask)) I SDATA. For instance, the current macroblock may be written using an INSERT instruction (e.g., INSERT $mbNeighCtxCurrent_1, #lmm10, SRC1). This latter operation does not affect the left 685 and top 683 pointers (i.e., only writes to the current position).

The INSERT instruction may write to mbNeighCtxCurrent 686. The left pointer 685 points to an element of the array which is identical (i.e., a copy) to the memory of an adjacent (adjacent to mbNeighCtxCurrent) array element (i.e., mbNeighCtx[i−1]). When the CWRITE instruction is issued, all or some of the contents of the mbNeighCtxCurrent structure is copied to the elements pointed to by the left pointer 685 and the top pointer 683, and the top pointer 683 is incremented by one (e.g., by operation of modulo macroblock per line). At a time corresponding to this copy operation (e.g., subsequently), the mbNeighCtxCurrent array element is cleared to zero.

The structure of the data held in mbNeighCtx memory 604 can be described as follows:
mbNeighCtxCurrent[01:00]:2'b: mbType
mbNeighCtxCurrent[65:02]:4'b: TC[16]
mbNeighCtxCurrent[81:66]:4'b: TCC[cb][4]
mbNeighCtxCurrent[97:82]:4'b: TCC[cr][4]

When the CWRITE instruction is performed, it updates the mbNeighCtx[ ]neighborhood data and initializes mbNeighCtxCurrent 686 afterwards.

Having described the context memory structures utilized by the CAVLC unit 530, the following describes how the CAVLC unit 530, and in particular, the CAVLC_TOTC instruction, uses the neighboring context information to calculate the TotalCoeff (TC), the latter which is used to determine which CAVLC tables should be used to decode the symbol. Generally, CAVLC decoding makes use of variable length decoding tables described under the H.264 specification (herein, CAVLC tables) where a CAVLC table is selected to decode each symbol based on the context of previously decoded symbols. That is, for each symbol there may be a different CAVLC table. A basic table structure is described below and shown in FIG. 6D as a variable size 2D array. That is, there is provided an array of "Table" (each of these tables may be for a particular symbol), and then each of these symbols is Huffman coded. This Huffman code is stored as table of following structure:

```
struct Table{
    unsigned head;
    struct table{
        unsigned val;
        unsigned shv;
    }table[ ];
}Table[ ];
```

Below, a scheme for matching (MatchVLC function) based on unique prefix coding is described. In general, it is observed that CAVLC tables are comprised of a variable length portion and a fixed length portion. Using this observation, matching can be simplified by performing a number of fixed-size indexed lookups. In a MatchVLC function, a READ operation is performed that does not remove bits from the sREG register 602a. Thus, the READ operation is different than the READ instruction expressed above for the bitstream buffer 602b, the latter which progresses the bitstream. In the MatchVLC function illustrated below, a number of bits (fixL) are copied from the bitstream buffer 602b, which are then looked up in the specified table. Each entry in the specified table consists of a dublet (e.g., value and size (in-bits)). The size is used to progress the bitstream.

```
FUNCTION MatchVLC(Table, maxIdx)
INPUT Table;
INPUT maxIdx;
    Idx1 = CLZ(sREG);    //count number of leading zeros
    Idx1 = (Idx1 > maxIdx)? maxIdx : Idx1;
    fixL = Table[Idx1].head;
    SHL(sREG, Idx1+#1);    //shift buffer Idx1+1 bit left
    Idx2 = (fixL)? 0 : READ(fixL);
    (val, shv) = Table[Idx1][Idx2];
    SHL(sREG, shv);
    return val;
ENDFUNCTON
```

FIG. 6D is a block diagram of an exemplary 2D array of the table structure above, and is used hereinafter to describe the MatchVLC function in the context of CAVLC decoding. The example is taken from Table 9-5 in the H.264 standard for when nC==−1, which is as follows:

| Coeff_token | TrailingOnes | TotalCoeff | Head | Value | Shift |
|---|---|---|---|---|---|
| 1 | 1 | 1 | 0 | 33 | 0 |
| 01 | 0 | 0 | 0 | 0 | 0 |
| 001 | 2 | 2 | 0 | 66 | 0 |
| 000100 | 0 | 2 | 2 | 2 | 2 |
| 000101 | 3 | 3 | | 99 | 2 |
| 000110 | 1 | 2 | | 34 | 2 |
| 000111 | 0 | 1 | | 1 | 2 |
| 000010 | 0 | 4 | 1 | 4 | 1 |
| 000011 | 0 | 3 | | 3 | 1 |
| 0000010 | 2 | 3 | 1 | 67 | 1 |
| 0000011 | 1 | 3 | | 35 | 1 |
| 00000010 | 2 | 4 | 1 | 68 | 1 |
| 00000011 | 1 | 4 | | 36 | 1 |
| 0000000 | 3 | 4 | 0 | 100 | 0 |

In terms of pseudocode, the above table can be expressed as follows:

```
Table9-5[8] = {
0, {{33, 0}},
0, {{0, 0}},
0, {{66, 0}},
2, {{2, 2}, {99, 2}, {34, 2}, {1, 2}},
1, {{4, 1}, {3, 1}},
1, {{67, 1}, {35, 1}},
1, {{68, 1}, {36, 1}},
0, {{100, 0}}
};
```

The above pseudocode can be expressed as the 2D table shown in FIG. 6D. Using such a table structure, the MatchVLC function described above can be used for implementing CAVLC decoding. Note from the MatchVLC function that a count leading zero is performed on the bitstream to provide access into the table for a given syntax element. Further, the MatchVLC function enables a parameterized clear zero (CLZ) operation by which if CLZ value is larger than a max Idx, then the maxIdx is returned (which handles the case for 0000000 as shown in the table in FIG. 6D). Another benefit of the MatchVLC function and table structure is that multiple instructions are unnecessary to handle these cases, which are handled by the following MatchVLC sections: Idx1=CLZ (sREG); //count number of leading zeros, and Idx1= (Idx1>maxIdx)? maxIdx:Idx1. The consumed bits are then removed using the following section of the MatchVLC function: SHL(sREG, Idx1+#1); //shift buffer Idx1+1 bit left. The header for the sub-array is read using the following MatchVLC sections: fixL=Table[Idx1].head, and Idx2=(!fixL)? 0:READ(fixL), which conveys the maximum number of bits to be speculatively read. The leading zero may be same, but the trailing bits may be variable in size. Hence, in one embodiment, CASEX-type case statements are implemented (using more "memory" but a simpler code structure).

The actual values from the table are read using (val, shv)= Table[Idx1][Idx2] and SHL(sREG, shv), which also reveals how many bits are actually used for this syntax element. These bits are removed the bitstream, and the value of the syntax element is returned in a destination register.

Having described the bitstream parsing, initialization of decoding engine and memory structures, and a method for VLC matching and configuration of a table structure, attention is returned to FIG. 6A to describe the CAVLC decoding engine or process (e.g., CAVLC logic 660). Once the bitstream is loaded and the decoding engine, memory structures, and registers are loaded, the coeff_token module 610 is enabled via the driver software 128 issuing a CAVLC_TOTC instruction, which in one embodiment has the following exemplary format:

CAVLC_TOTC DST, S1, where S1 and DST comprises an input register and an internal output register, respectively, having the exemplary formats provided below:

SRC1 [3:0]=blkIdx
SRC1 [18:16]=blkCat
SRC1 [24]=iCbCr

The remaining bits are undefined. The output format is as follows:

DST [31:16]=TrailingOnes
DST [15:0]=TotalCoeff

Thus, as shown, the coeff_token module 610 receives information corresponding to the mbCurrAddr, mbType, an indication as to whether a chroma channel is under process (e.g., iCbCr), and blkIdx (e.g., the block index, since the picture may be broken up into many blocks). For a given macroblock accessed from the bitstream buffer 602b, the blkIdx conveys whether an 8×8 pixel block or 4×4 pixel block is under process at a given location. Such information is provided by the driver software 128. The coeff_token module 610 comprises a look-up table. Based on the above-described inputs to the look-up table of the coeff_token module 610, the trailing ones (TrailingOnes) and total coefficients (TotalCoeff) are obtained. The trailing ones convey how many 1s are in a row, and the total coefficients convey how many run/level pair coefficients are in a chunk of data pulled from the bitstream. The TrailingOnes and a TotalCoeff are provided to the CAVLC_Level module 614 and CAVLC_ZL module 618, respectively. The TrailingOnes is also provided to CAVLC_L0 module 616, which corresponds to the first level (e.g., the direct current (DC) values) extracted from the bitstream buffer 602b.

The CAVLC_Level module 614 keeps a track of the suffix length of the symbol (e.g., the number of trailing ones), and combined with LevelCode, calculates the level value (level [Idx]), the latter of which is stored in the level array 622 and run array 624. The CAVLC_Level module 614 operates under the CAVLC_LVL instruction, which has the following format:

CAVLC_LVL DST, S2, S1, where:

S1=Idx (16-bit),
S2=suffixLength (16-bit), and
DST=suffixLength (16-bit).

The suffixLength conveys how large the code word is going to be. Input coming from the driver software 128 provides information that specifies what the suffixLength is to be. Additionally, it is noted that in one embodiment, DST and S2 may be chosen to be the same register since the suffixLength value is updated.

Note further that forwarding registers (e.g., holding data generated internally by a given module), such as F1 665 and F2 667 (FIG. 6B), may also be used. Whether an instruction, and hence corresponding module, uses a forwarding register is indicated by forwarding flags in the given instruction. Symbols to represent the forwarding registers may include F1 (i.e., forwarded source 1 value is to be used, which in one embodiment may be indicated by bit 26 in the instruction) and F2 (i.e., forwarded source 2 value is to be used, which in one embodiment may be indicated by bit 27 in the instruction). When forwarding registers are used, the CAVLC_LVL instruction may take on the following exemplary format:

CAVLC_LVL.F1.F2 DST, SRC2, SR1, where if either F1 or F2 are set (e.g., at one (1)), then the specified forwarded source is taken as input. In the case of the CAVLC_Level module 614, forwarding register F1 corresponds to a level index (level[Idx]) generated by the CAVLC_Level module 614 that is incremented at an increment module and input to multiplexer 630. Also forwarding register F2 corresponds to the suffixLength that is generated by CAVLC_Level module 614 and input to multiplexer 628. Other inputs to multiplexer 630 and multiplexer 628 includes EU register inputs (represented in FIG. 6A as EU), as described below.

An additional input to CAVLC_Level module 614 is levelCode, as provided by the CAVLC_LevelCode module 612 and referred to above. The combined operations of the CAVLC_LevelCode module 612 and CAVLC_Level module 614 decode the level value (level is the value of the transform coefficient before scaling). The CAVLC_LevelCode module 612 is enabled through an instruction having the following exemplary format:

CAVLC_LC SRC1, where SRC1=suffixLength (16-bit). If forwarding register F1 665 is used, then the instruction is expressed as follows:

CAVLC_LVL.F1 SRC1, where if F1 is set, then forwarded SRC1 is taken as the input. That is, and as shown in FIG. 6A, if F1 is set (e.g., F1=1), the CAVLC_LevelCode module 612 takes the forwarded SRC1 value (e.g., suffixLength from CAVLC_Level module 614) as an input, otherwise input is taken from an EU register (e.g., if F1=0).

Returning to the CAVLC_Level module 614, the suffixLength input can either be forwarded by CAVLC_Level module 614 via multiplexer 628 or provided via an EU register through multiplexer 628. Additionally, the Idx input can likewise either be forwarded by CAVLC_Level module 614 via multiplexer 630 (and incremented by increment module, or in some embodiments, auto-incremented without the increment module), or via an EU register through multiplexer 630. Further, the CAVLC_Level module 614 also receives levelCode input directly from the CAVLC_LevelCode module 612. In addition to the output to forwarding registers, the CAVLC_Level module 614 also provides a level index (level[idx]) output to the level array 622.

As referenced above, the TrailingOnes output (e.g., the DC values) is provided to the CAVLC_L0 module 616. The CAVLC_L0 module 616 is enabled by the following instruction:

CAVLC_LVL0 SRC, where SRC=trailingOnes(coeff_token). The output of the CAVLC_L0 module 616 comprises a level index (Level [Idx]), which is provided to the level array 622. The coefficient values are coded as sign, magnitude. The CAVLC_L0 module 616 provides the sign value for the coefficient. The magnitude from the CAVLC_Level module 614 is combined with the sign from CAVLC_L0 616 and written to the level array 622. The write location is specified using the level index (level[idx]). The coefficients, in one embodiment, are in a 4×4 matrix for a sub-block (blocks are 8×8), yet not in raster order. This array is later converted to a 4×4 matrix. In other words, the coefficient level and run as decoded are not in raster format. From the level-run data, 4×4 matrix can be reconstructed (but in the zig-zag scan order), and then re-ordered into raster order 4×4.

The TotalCoeff output from the coeff_token module 610 is provided to the CAVLC_ZL module 618. The CAVLC_ZL module 618 is enabled through the following instruction:

CAVLC_ZL DST, SRC1, where SRC1=maxNumCoeff(16-bit) and DST=ZerosLeft (16-bit). The maxNumCoeff is given in the H.264 standard, and is passed to as a source value in the instruction. In other words, the maxNumCoeff is set by the software. In some embodiments, the maxNumCoeff may be stored as a value in hardware. The transform coefficients are coded as (level, run) dublets, which refer to the number of coefficients (levels) which are coded as zero. The CAVLC_ZL module 618 provides two outputs, ZerosLeft and Reset (reset=0), which are provided to multiplexers 640 and 642, respectively. The multiplexer 640 also receives a forwarding register, F2, from CAVLC_Run module 620. The register 642 receives an incremented (via increment module or otherwise in some embodiments) forwarding register, F1, from the CAVLC_Run module 620.

The CAVLC_Run module 620 receives the ZerosLeft and Idx inputs from the respective multiplexers 640 and 642, and provides a run index (Run[Idx]) output to the run array 624. As mentioned above, coefficients are coded as a (level, run) dublet because run-length coding is used as further compression. For example, assuming possession of the following set of values 10 12 12 15 19 1 1 1 0 0 0 0 0 0 1 0, then this may be coded as (10,0)(12,1)(15,0)(19,0)(1,2)(0,5)(1,0)(0,0). This codeword is often shorter. The index is the corresponding index to the level index. The CAVLC_Run module 620 is enabled through the following instruction:

CAVLC_RUN DST, S2, S1, where DST and S2 may be chosen to be the same register since the ZerosLeft value is updated. Thus, exemplary unsigned values for CAVLC_Run are found as follows:

S1=Idx(16-bit),
    S2=ZerosLeft(16-bit),
    DST=Zerosleft(16-bit)

As noted from FIG. 6A, forwarding registers may be used, in which case the CAVLC_RUN instruction may take on the following format:

CAVLC.F1.F2 DST, SRC2, SRC1, register, the least significant 16-bits contain the value LEVEL[0], bits 16-31 contain the value LEVEL[1], etc., until bits 112-127 contain the value LEVEL[7]. Then for the second register pair, the least significant 16-bits contain LEVEL[8], etc. The same methodology applies for the RUN values.

Another instruction is used to clear the run array 624 and level array 624 registers according to the following exemplary instruction format:

CLR_LRUN.

The above-described software (shader programming) and hardware operations (e.g., modules) of the decoding system 200 (e.g., CAVLC unit 530) can be described using the following pseudocode:

```
Residual_block_cavlc( coeffLevel, maxNumCoeff ) {
    CLR_LEVEL_RUN
    coeff_token
        if( TotalCoeff( coeff_token ) > 0 ) {
            if( TotalCoeff( coeff_token ) > 10 && TrailingOnes( coeff_token ) < 3 )
                suffixLength = 1
            Else
                suffixLength = 0
    CAVLC_level0();
            for( I = TrailingOnes(coeff_taken); I < TotalCoeff( coeff_token ); i++ ){
                CAVLC_levelCode(levelCode,suffixLength);
                CAVLC_level(suffixLength, i,levelCode)
            }
            CAVLC_ZerosLeft(ZerosLeft, maxNumCoeff)
                for( i = 0; i < TotalCoeff( coeff_token ) - 1; i++ ) {
                    CAVLC_run(i, ZerosLeft)
                        READ_LEVEL_RUN(level, run)
                        run[ TotalCoeff( coeff_token ) - 1 ] = zerosLeft
                coeffNum = -1
                for( i = TotalCoeff( coeff_token ) - 1; i >= 0; i-- ) {
                    coeffNum += run[ i ] + 1
                    coeffLevel[ coeffNum ] = level[ i ]
                }
        }
}
``` where if either F1 or F2 are set, then the appropriate forwarded source is taken as input.

With regard to the two register arrays, level array 622 corresponding to the level and run array 624 corresponding to the run, in one embodiment, each of these arrays consists of sixteen (16) elements. For the level array 622, the size of each element comprises a 16-bit signed value, and for the run array 624, the values are 4-bit unsigned. The run and level values are read from the run array 624 and level array 622, respectively, using the following instruction:

READ_LRUNDST, where DST comprises, in one embodiment, four 128-bit consecutive temporary registers (e.g., EU temporary or common registers). This operation reads the level 622 and run 624 registers in the CAVLC unit 530 and stores them in a destination register, DST. When the run is read and stored in the temporary registers, the run values are converted to 16-bit unsigned values. For instance, the first two registers hold the sixteen 16-bit LEVEL (i.e., the array stores the first sixteen coefficients) values, and the third and fourth registers hold the sixteen 16-bit RUN values. If there are more than sixteen coefficients, they are decoded to memory. In one embodiment, the values are written in the following order: in the first It should be emphasized that the above-described embodiments, particularly, any "preferred" embodiments, are merely possible examples of implementations, merely set forth for a clear understanding of the principles of the disclosed systems and methods. Many variations and modifications may be made to the above-described embodiment(s). All such modifications and variations are intended to be included herein within the scope of this disclosure and protected by the following claims.

At least the following is claimed:

1. A decoding system in a graphics processing unit, comprising:

a software programmable core processing unit having a context-adaptive variable length coding (CAVLC) unit capable of performing shader functionality, the shader functionality including implementing CAVLC decoding of a video stream and providing a decoded data output, wherein the CAVLC unit is further configured to use bits in an instruction to determine whether a result of a previous operation stored in an internal register should be used or a data in a source operand should be used for a current operation at one or more modules, wherein the CAVLC decoding is implemented using a combination of software and hardware.

2. The system of claim 1, wherein the CAVLC decoding is accomplished with the context of graphics processing unit programming, with the hardware implementation in a graphics processing unit data path.

3. The system of claim 1, wherein the CAVLC unit further comprises a coefficients token (coeff_token) module configured to receive macroblock information, and, responsive to a first shader instruction (CAVLC_TOTC), provide trailing ones information and total coefficient information.

4. The system of claim 3, wherein the CAVLC unit further comprises a level (CAVLC_Level) module configured to receive the trailing ones information and level code information, and, responsive to a second instruction (CAVLC_LVL), provide suffix length information and level index (Level[Idx]) information.

5. The system of claim 4, wherein the CAVLC unit further comprises a level code (CAVLC_LevelCode) module configured to receive the suffix length information and, responsive to a third shader instruction (CAVLC_LC), provide the level code information to the CAVLC_Level module.

6. The system of claim 5, wherein the suffix length information is received at the CAVLC_LevelCode module through one of a forwarding register (F1) and an execution unit (EU) register.

7. The system of claim 5, wherein the suffix length information and the level index (Level[Idx]) information is received at the CAVLC_Level module through one of a forwarding register (F2) and an execution unit (EU) register, wherein the level index (Level[Idx]) information is incremented.

8. The system of claim 4, wherein the CAVLC unit further comprises a level0 (CAVLC_L0) module configured to receive the trailing ones information and, responsive to a fourth shader instruction (CAVLC_LVL0), provide second level index information (Level[Idx]) to a level array (622).

9. The system of claim 8, wherein the CAVLC unit further comprises a zero level (CAVLC_ZL) module configured to receive the total coefficients information and a maximum number of coefficients information and, responsive to a fifth shader instruction (CAVLC_ZL), provide a zeros left information and a reset value to first and second multiplexers.

10. The system of claim 9, wherein the CAVLC unit further comprises a run (CAVLC_Run) module configured to receive the zeros left information and second index information from the first and second multiplexers, respectively, and, responsive to a sixth shader instruction (CAVLC_RUN), provide a run index (Run[Idx]) to a run array.

11. The system of claim 10, wherein the first and second multiplexers are configured to receive the zeros left information and the second index, respectively, from first (F2) and second (F1) forwarding registers, respectively.

12. The system of claim 10, wherein the level array and the run array are configured to provide a decoded level value and decoded run value, responsive to a seventh shader instruction (READ_LRUN) and configured to be cleared responsive to an eighth shader instruction (CLR_LRUN).

13. The system of claim 1, wherein the CAVLC unit further comprises a direct memory access (DMA) engine module comprising a bitstream buffer and DMA engine, the DMA engine module configured to, responsive to execution of a shader instruction per slice, repeatedly and automatically buffer in the bitstream buffer a predefined quantity of bits as the predefined bits are consumed, the bits corresponding to the video stream.

14. The system of claim 13, wherein the CAVLC unit is further configured to stall the DMA engine module responsive to anticipated underflow in the bitstream buffer.

15. The system of claim 13, wherein the DMA engine is further configured to track the number of bits consumed in the bitstream buffer, and responsive to detecting that the number is larger than a predefined quantity, halting the bitstream buffer operation and transferring control to a host processor.

16. A decoding method, comprising:
loading shader functionality to a programmable core graphics processing unit having a context-adaptive variable length coding (CAVLC) unit, the CAVLC unit capable of performing shader functionality;
CAVLC decoding a video stream by executing shader functionality on the CAVLC unit; and
providing a decoded data output; and
wherein the CAVLC unit using bits in an instruction to determine whether a result of a previous operation stored in an internal register should be used or a data in a source operand should be used for a current operation at one or more modules.

17. The method of claim 16, wherein the CAVLC decoding is accomplished with the context of graphics processing unit programming, with the hardware implementation in a graphics processing unit data path.

18. The method of claim 16, further comprising:
receiving at a coefficients token (coeff_token) module of the CAVLC unit macroblock information;
responsive to a first shader instruction (CAVLC_TOTC), providing trailing ones information and total coefficient information;
receiving at a level (CAVLC_Level) module of the CAVLC unit the trailing ones information and level code information;
responsive to a second shader instruction (CAVLC_LVL), providing suffix length information and level index (Level[Idx]) information;
receiving at a level code (CAVLC_LevelCode) module of the CAVLC unit the suffix length information; and
responsive to a third shader instruction (CAVLC_LC), providing the level code information to the CAVLC_Level module.

19. The method of claim 18, wherein the suffix length information and the level index (Level[Idx]) information is received at the CAVLC_Level module through one of a forwarding register (F2) and an execution unit (EU) register, wherein the level index (Level [Idx]) information is incremented.

20. The method of claim 18, further comprising receiving at a level0 (CAVLC_L0) module of the CAVLC unit the trailing ones information and, responsive to a fourth shader instruction (CAVLC_LVL0), providing second level index information (Level[Idx]) to a level array.

21. The method of claim 20, further comprising:
receiving at a zero level (CAVLC_ZL) module of the CAVLC unit the total coefficients information and a maximum number of coefficients information;
responsive to a fifth shader instruction (CAVLC_ZL), providing a zeros left information and a reset value to first and second multiplexers;
receiving at a run (CAVLC_Run) module of the CAVLC unit the zeros left information and second index information from the first and second multiplexers, respectively; and
responsive to a sixth shader instruction (CAVLC_RUN), providing a run index (Run[Idx]) to a run array.

22. The method of claim 21, wherein the first and second multiplexers are configured to receive the zeros left information and the second index, respectively, from first (F2) and second (F1) forwarding registers, respectively.

23. The method of claim 21, further comprising providing by the level array and the run array a decoded level value and decoded run value, respectively, responsive to a seventh shader instruction (READ_LRUN).

24. The method of claim 21, further comprising clearing the level array and the run array responsive to an eighth shader instruction (CLR_LRUN).

25. The method of claim 16, further comprising, responsive to execution of a shader instruction per slice, repeatedly and automatically buffering in a bitstream buffer a predefined quantity of bits as the predefined bits are consumed, the bits corresponding to the video stream.

26. The method of claim 25, further comprising stalling consumption of the bits in the bitstream buffer responsive to anticipated underflow in the bitstream buffer.

27. The method of claim 25, further comprising tracking the number of bits consumed in the bitstream buffer, and responsive to detecting that the number is larger than a predefined quantity, halting the bitstream buffer operation and transferring control to a host processor.

* * * * *